United States Patent
Fablet et al.

(10) Patent No.: US 9,208,256 B2
(45) Date of Patent: Dec. 8, 2015

(54) METHODS OF CODING AND DECODING, BY REFERENCING, VALUES IN A STRUCTURED DOCUMENT, AND ASSOCIATED SYSTEMS

(75) Inventors: Youenn Fablet, La Dominelais (FR); Franck Denoual, Saint Domineuc (FR)

(73) Assignee: Canon Kabushiki Kaisha, Tokyo (JP)

( * ) Notice: Subject to any disclaimer, the term of this patent is extended or adjusted under 35 U.S.C. 154(b) by 676 days.

(21) Appl. No.: 12/500,939

(22) Filed: Jul. 10, 2009

(65) Prior Publication Data
US 2010/0010995 A1    Jan. 14, 2010

(30) Foreign Application Priority Data
Jul. 11, 2008 (FR) ...................... 08 54788

(51) Int. Cl.
*G06F 17/30* (2006.01)
*H03M 7/30* (2006.01)

(52) U.S. Cl.
CPC ........... *G06F 17/30917* (2013.01); *H03M 7/30* (2013.01)

(58) Field of Classification Search
CPC ........................... H03M 7/30; G06F 17/30917
USPC .................................. 707/693, 741, 999.101
See application file for complete search history.

(56) References Cited

U.S. PATENT DOCUMENTS

| | | | |
|---|---|---|---|
| 5,151,697 A * | 9/1992 | Bunton | 341/51 |
| 5,373,290 A * | 12/1994 | Lempel et al. | 341/51 |
| 5,502,439 A * | 3/1996 | Berlin | 341/51 |
| 5,867,114 A * | 2/1999 | Barbir | 341/107 |
| 5,951,623 A * | 9/1999 | Reynar et al. | 708/203 |
| 6,104,323 A * | 8/2000 | Cho | 341/51 |
| 6,388,585 B1 * | 5/2002 | Lacerda | 341/51 |
| 7,315,981 B2 * | 1/2008 | Nakamura et al. | 715/234 |
| 2002/0152219 A1 * | 10/2002 | Singh | 707/101 |
| 2003/0086620 A1 * | 5/2003 | Lucco | 382/232 |
| 2004/0189494 A1 * | 9/2004 | Jones et al. | 341/51 |
| 2007/0239881 A1 * | 10/2007 | Schneider et al. | 709/231 |
| 2008/0140645 A1 | 6/2008 | Denoual | 707/5 |
| 2008/0320031 A1 | 12/2008 | Denoual | 707/102 |
| 2009/0183067 A1 | 7/2009 | Fablet | 715/234 |

OTHER PUBLICATIONS

Adiego, J., et al., "Lempel-Ziv Compression of Highly Structured Documents", Journal of the American Society for Information Science and Technology, vol. 58, No. 4, Jan. 25, 2007, pp. 461-478.

Adiego, J., et al., "Lempel-Ziv Compression of Structured Text", Data Compression Conference, 2004 (DCC'04), Mar. 23-25, 2004, pp. 112-121.

* cited by examiner

*Primary Examiner* — Alexey Shmatov
*Assistant Examiner* — Hubert Cheung
(74) *Attorney, Agent, or Firm* — Fitzpatrick, Cella, Harper & Scinto

(57) ABSTRACT

The present invention concerns coding an XML-type structured document. The structured document includes values to be coded. The coding uses at least one indexing dictionary which includes entries. At least one entry value of the dictionary linked to the value to be coded is identified, by matching between at least part of one of the values and a subpart of the other value. The value to be coded is coded by reference, according to the matching, to at least the identified entry of the dictionary.

25 Claims, 9 Drawing Sheets

```
<list>
<person>
        <firstName>Mary</firstName>
        <lastName>Smith</lastName>
        <city>London</city>
</person>
<person>
        <firstName>John</firstName>
        <lastName>Williams</lastName>
        <city>Liverpool</city>
</person>
<person>
        <firstName>Mary Lisa</firstName>
        <lastName>Londasle</lastName>
        <city>Liverpool</city>
</person>
</list>
```

Figure 1

| | Character and Attribute Values |
|---|---|
| 0 | « Mary » |
| 1 | « Smith » |
| 2 | « London » |
| 3 | « John » |
| 4 | « Williams » |
| 5 | « Liverpool » |
| 6 | « Mary Lisa » |
| 7 | « Londasle » |

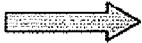

| | Character and Attribute Values |
|---|---|
| 0 | « Mary » |
| 1 | « Smith » |
| 2 | « London » |
| 3 | « John » |
| 4 | « Williams » |
| 5 | « Liverpool » |
| 6 | Ref(0), « Lisa » |
| 7 | Ref(2,0,4), « asle » |

Figure 2           Figure 3

METHODS OF CODING AND DECODING, BY REFERENCING, VALUES IN A STRUCTURED DOCUMENT, AND ASSOCIATED SYSTEMS

This application claims priority from French Patent Application No 08/54788 filed on Jul. 11, 2008, the entire contents of which are incorporated in the disclosure of the present application.

The present invention concerns a method of coding a structured document, a corresponding decoding method and associated systems.

Structured documents are documents that contain information with regard to their logic, semantic and intellectual structure. Conventional examples are the HTML format (standing for "Hypertext Markup Language"), or the XML format, reference to which will be made in the remainder of the description.

The XML language (the acronym for "Extensible Markup Language") is a syntax for defining computer languages adapted to different uses, but able to be processed by the same tools.

As is known per se, an XML document is composed of elements defined by an opening tag containing the name of the element (for example <tag>) and by a closing tag also containing the name of the element (for example </tag>). These elements can contain other elements in a hierarchical fashion or text data.

Other types of XML data are known per se. XML data are generally described by items, each item being able to be a start of an element, an end of an element, an "attribute", "text data", a "comment", a "processing instruction" and an "escape section".

In order to be able to mix several different XML languages sometimes having elements bearing the same name, an addition has been made to the XML syntax making it possible to define Namespaces by associating a prefix with a URI (the acronym for "Uniform Resource Identifier"). In use, the namespace of an element or of an attribute is specified by preceding its name with the prefix associated with the namespace followed by ":" (for example: "<ml:tag ml:attribute="value">" indicates that the element tag stems from the namespace ml and that the same applies to the attribute attribute).

The XML format has many advantages and has become a reference language for storing data in a file or for exchanging data. XML in particular makes it possible to have numerous tools available for processing the generated files. Moreover, an XML document can be edited manually with a simple text editor. In addition, as an XML document contains its structure integrated in the data, this document is highly legible even without knowing its specification.

Nevertheless, the main drawback of structured languages, here the XML syntax, is that of being very prolix. Thus the size of an XML document may be several times greater than the intrinsic size of the data. This large size of XML documents also gives rise to a long processing time when XML documents are generated and read.

To remedy these drawbacks, methods for encoding an XML document have been sought. The aim of these methods is to code the content of the XML document in a more effective form, whilst making it easily possible to reconstruct the XML document. However, the majority of these methods do not keep all the advantages of the XML format.

Among these methods, the simplest consists of coding the structure data in a binary format instead of using a text format. In addition, the redundancy of the structural information in the XML format can be dispensed with or at least reduced. For example, it is not necessarily essential to specify the name of the element in the opening tag and the closing tag.

Another method is to use one or more index tables, in particular for character strings, for example the names of elements and attributes, which are generally repeated in an XML document. Thus, when an element name first occurs, this is coded normally in the file and an index is associated with it. Then, for the following occurrences of this element name, the index is used in place of the complete string, reducing the size of the document generated but also facilitating reading. This is because there is no longer any need to read the complete string in the file and in addition the element to read can be determined by a comparison of integers instead of a comparison of character strings.

Finally, beyond these elementary methods, there exist more advanced methods consisting in particular of taking into account a larger number of items of structural information of the document in order to compress the data further.

The case of the "Efficient XML" format can be cited amongst other things, which takes into account the order of appearance of the various items within a document in order to construct, in a developing fashion, a grammar of productions that makes it possible to encode the most frequent items in a small number of bits. Each production comprises an XML event (or item) description, an associated coding value and an indication of the following grammar to be used. An XML event is then coded using the coding value corresponding to the production containing the most precise description of the XML event.

The information contained in the event and not described in the production is coded. This information, generally in the form of a character string, is coded by means of index dictionaries or tables as explained previously: the first occurrence of a character string is coded with its length and then inserted in the dictionaries in order to represent the future occurrences by the index of the string in the dictionaries rather than by its value.

The grammar is open to development in that, after the occurrence of an XML event already described by a production of the grammar, the grammar is modified in order to include a new, more effective production corresponding to this XML event. Thus this production can either contain a more precise description of the event, reducing the number of items of information to be coded to represent the event, or have a more compact coding value.

The grammar or production rules used may either be generic rules, common to all the XML documents and constructed from XML syntax, or be rules specific to a type of document, constructed from an XML schema describing the structure of this type of document (by describing all the elements and attributes that may be present in the XML document, as well as the relationships between these elements and attributes).

During decoding, the reverse process is used: the coding value is extracted and makes it possible to identify the coded XML event, as well as the complementary information to be decoded.

In addition, during decoding, the same grammar development rules are used, making it possible to have at any time a set of grammar rules identical to that which was used during the coding at the same point in the XML document.

An alternative to the Efficient XML format is known as the Fast Infoset format allowing a more compact representation of an XML document by using binary event codes for the structural data and indexing tables for the values in the form of character strings (content or structure values, typically the text data and the attributes).

In this format, the types of events are described as a list that uses variable-length binary codes. This format uses the indexing techniques by creating tables for sets of precise XML values. These tables make it possible to encode a given value in a literal manner, for example in the form of UTF8 or UTF16 formats (where UTFx is the acronym for x-bit "UCS transformation format"), the first time that this information is encountered during the encoding of the document. This information is then added to the indexing table and associated with an index.

Subsequently, when this information is detected once again in the XML document, the corresponding index is recovered in the indexing table and the value of this index is then encoded in place of the information. It is thus possible to obtain an appreciable compression of the data.

A certain number of indexing tables should be noted, including:
- two tables indexing respectively the prefixes and the URIs in order to define the name spaces;
- two specific tables indexing respectively the attribute values and the text node values;
- a table indexing the local names of attributes and elements;
- two specific tables indexing respectively firstly the qualified names (which group together for example a prefix, a URI and a local name) of elements, and secondly the qualified names of attributes.

It may be noted that the Fast Infoset standard enables the encoder to decide whether such and such an attribute or text node value is to be indexed, for example according to the length of the value or of the character string. This makes it possible, in particular, to limit the size of the memory used by the encoder. The decision to index an attribute or text node value, or not, is then encoded in the Fast Infoset stream to enable the associated decoder to index the values to be decoded, or not.

Thus, for these different coding solutions, a particular processing of the structure data is generally carried out (for example use of productions) and a separate processing of the attribute, element, text data, prefix etc. values using index dictionaries such as the aforementioned tables.

However, all these coding techniques by means of dictionaries are based, for coding a given value, on searching for an identical value within these dictionaries: either the value is present in its entirety and the corresponding index is used for coding, or the value is absent from the dictionaries and its length and value are then coded. These techniques therefore use the potential repetitions of the values in the form of character strings, for example a structure value representing the attribute or element name that is repeated, a content value corresponding to the attribute value and to a text data item of the XML tree that is also repeated.

The invention aims to improve these coding techniques by means of dictionaries, by using the correlation that may exist between various character strings and in particular those within the same XML document. This is because the latter is generally formed from words or character strings stemming from the same language, for example French. This correlation may in particular be illustrated by subparts of character strings identical from one word to another.

To this end, the invention relates in particular to a method of coding a structured document comprising at least one value to be coded, using at least one coding dictionary, also referred to hereinafter as an indexing dictionary, comprising entries, the method comprising the following steps:

- identifying at least one entry value of the dictionary linked to the value to be coded by a match between at least part of one of these two values and a subpart of the other value;
- coding said value to be coded by reference, according to said match, to at least one identified entry in the dictionary.

Here subpart of a value means a non-whole part of this value. Thus, according to the invention, two situations present themselves: on the one hand, when only a subpart of the value to be coded corresponds to all or part of an entry value of the dictionary, and on the other hand when the value to be coded in its entirety corresponds to only a subpart of an entry value of the dictionary.

By virtue of the method according to the invention, similarities are initially determined between the value to be coded and the values already coded in the dictionary so that, for coding the first, use is made of the coding information of the second even though the two values are different.

In this way a reduction in the size of the dictionaries used is obtained since either the value to be coded in its entirety corresponds to one or more subparts of entry values of the dictionary and it is possible to avoid inserting a new entry in the dictionary, or the entry inserted for this new value to be coded has a reduced number of information bits because the reference to another entry in the dictionary is less expensive than the presence of the entire value.

This coding does not modify the organisation of the data of the structured document and therefore remains compatible with coding or decoding processing on the fly as will be illustrated hereinafter.

It will easily be understood that, by having available, for only a subpart of the value to be coded, a reference to a value already coded, the coding of the rest of the value to be coded may be proceeded with. It is possible to use either conventional coding, or to apply the invention for several subparts as mentioned below.

In particular, the said values comprise character strings and said identification comprises the search for the string or a substring of characters of the value to be coded in a plurality of entry values of the dictionary. Thus, for coding, the reference comprises the identification of the entry value identified, as well as, the location of the string or substring of characters recognised in this entry value.

In practice, it will be ensured that the search is initiated by means of a substring of predetermined size, three characters for example. However, the similarity between the character strings may be greater than three characters. Thus, when said identification comprises the search for a substring and in the case of a positive search (that is to say when an entry whose value comprises said substring has been found), provision is made for at least one character to be added to said search substring so as to search for the thus increased substring in said plurality of entry values of the dictionary. Thus, progressively, the entry having the greatest similarity with the value to be coded is identified. To do this, the following are repeated until a criterion is achieved and as long as the search is positive:

- the addition of at least one character to said search substring;
- said search for the thus increased substring in said plurality of entry values of the dictionary.

Such a criterion may for example relate to the size of the substring (deemed to be sufficiently great) or to the time spent in searching.

Finally, the whole of the string of the value to be coded may have to be sought in the dictionary entries.

Character strings to be coded may be sufficiently large for the same substring to be repeated several times in the whole string to be coded. It may therefore prove to be effective to carry out coding by "internal" reference relying on an auto-correlation. For this purpose, provision is made for said dictionary to comprise an entry corresponding to an already coded substring of said value to be coded so that a subsequent substring of said value to be coded can be coded with reference to said substring already coded. It will be understood here that the dictionary must be interpreted very generally as all the values already coded associated with information, codes or coding indexes, even if this set is distributed in several memories or tables.

In one embodiment, when several entry values found comprise said search substring, one of said entries found is selected according to a predetermined criterion, for example according to a compression criterion, a decoding speed criterion or a proximity criterion, so that said coding is carried out with reference to said selected entry.

In the light of the functioning described above, it will be understood that, when no entry value is identified for the search substring, it is possible to insert, in said dictionary, a new entry associating said search substring with coding data of said search substring that has not been found. In this way developing dictionary tables are maintained.

In one embodiment, at least one said dictionary comprises a plurality of entries corresponding to predefined values before coding. Thus it is possible to favor, for coding, certain values or character strings independently of the XML document to be processed.

In a variant or in combination, the method can comprise at least one prior step of coding a prior value preceding said value to be coded in the document and a prior step of adding, to said at least one dictionary, an entry corresponding to the prior value, a method wherein the reference during said coding by reference then relates to said added entry. This progressive formation of the dictionary along with the coding corresponds to the conventional production of coding dictionaries by the insertion, for the majority of the time, of pairs (index, value) for each coded value.

According to this embodiment of the invention, the dictionary formed conventionally is reused in order to take coding references from it.

In one embodiment, said coding by reference comprises the coding of an item of identification information of the indexing dictionary and of said entry identified in this dictionary, as well as information on location of the substring, which may comprise position information, referred to as "offset", in said identified entry value and length information, generally corresponding to the size of the character substring or subpart used during the identification step.

Thus provision is also made for the method to comprise a step, prior to said identification, of selecting at least one dictionary from a plurality of dictionaries, said selection depending on the type of the value to be coded. The type should be understood here in a wide sense: it comprises in particular the type of event (start of tag, text node) and the context of the value (value of an attribute "a", tag name whose parent is "b" etc). In this way the attribute indexing dictionary is selected only when an attribute is encoded (as for the other types of values to be coded).

In a variant, said coding by reference comprises the coding of a coding data item corresponding to an entry of at least one dictionary of references, an entry of said dictionary of references giving identification information on an entry of a coding dictionary, positioning information and length information. In using such dictionaries of references, a better compression and coding efficacy is achieved, since all the reference information is solely replaced for example by the index of the corresponding entry in the dictionary of references. This dictionary of references can be created on the same basis as the coding dictionaries, with in particular the insertion of a reference as an entry at the first appearance occurrence.

Whatever the mode chosen, it is possible to provide for said identification information to comprise an identifier of a dictionary among a plurality of coding dictionaries (for example local, internal or global) and an identifier of said entry identified within said dictionary. In practice, local dictionaries are favored (a local dictionary corresponds for example to all the values of an attribute "a". On the other hand, a global dictionary corresponds to all the values of attributes and/or elements already encoded). This is because the references of local types are frequent since the various values of XML elements sharing the same name are generally similar. Because the local dictionaries have fewer entries than a global dictionary, it is possible to encode the index of the entry identified in a more compact manner.

In particular, with each coding dictionary, provision is made in this case for a range of indices to be associated for the identification of their entries. Then the identifier of said entry identified is encoded in relation to said range, in particular by encoding the difference between this identifier and the first index. In this way the number of bits used for the encoding of this identification information is minimized.

It has been observed that, in many cases of XML values, subparts corresponding either to the start or to the end of a value of the dictionary are found. These two particular cases therefore correspond to particular encodings of the offset value. To this end, provision is made for the positioning information to comprise: a first code when said part or subpart of the value to be coded (i.e., the search substring) corresponds to the start of the entry value identified; of a second code when said part or subpart of the value to be coded corresponds to the end of the entry value identified, or an offset value of the position of said part or subpart of the value to be coded in the entry value identified, in other cases. Generally this offset is established in relation to the start of the entry value. It is thus possible to use specific compact codes for the start and end instead of coding an offset on a large number of bits (which generally depends on the number of characters of the entry value).

Provision is also made for determining preferential positions in the entry value identified, in particular according to at least one predetermined character of the punctuation type, for example. Said positioning information is established, at least in said other cases, in relation to at least one of said preferential positions determined. Once again, these preferential positions make it possible to use more compact codes for identifying the positioning.

According to one characteristic of the invention, the length information comprises a code among a finite set of codes with a length corresponding respectively to a finite set of lengths, and a third code combined with a value for the lengths not included in said set. This embodiment makes it possible to optimise the coding in a simple fashion by associating the short lengths (the references to the short substrings are more frequent than the references to long substrings) with the short codes.

In particular, the said positioning and length information is jointly encoded by an adaptive encoding of said first code, second code, third code and length codes. In this way a more compact coding is achieved.

In one embodiment, the method also comprises a step of adding, to the coded data corresponding to the coded value, an indication giving information about the end of the coded value, in particular through either the encoding of the number of bytes used for encoding said value making it possible in this way to easily skip the decoding of this value if it is not useful to the application or decoding, or through the encoding of the number of characters of the value, or lastly through the encoding of a symbol for the end of the encoded value. This indication makes it possible to carry out, as explained below, an effective decoding of the coded stream resulting from the coding method that is the object of the invention.

According to one characteristic of the invention, the coding of the references to an entry of the coding dictionary uses at least one fixed encoding table, for example Huffman. It is therefore a case of a static coding where the coding values used, once defined, remain unchanged. This makes it possible in particular to define them early. According to this embodiment of the invention, rapid decoding is obtained whatever the position of the data to be decoded in the document.

According to another characteristic of the invention, the coding of the characters and references is effected by series of bytes with a static coding. A character is represented in the form of one or more bytes, the most frequent characters (ASCII characters in particular) being coded in a single byte. Likewise the references are coded in series of bytes, the frequent types of references being coded in a small number of bytes (two bytes for example) and the less frequent types of reference being coded in a large number of bytes (three bytes and more). The advantage of this implementation is, in particular, an easy integration with Fast Infoset (byte-oriented format), and gains in terms of compression by means of a minimum extra processing cost since the decoding is carried out on a series of bits rather than bit by bit.

In a variant, the coding of said references uses at least one adaptive coding table, the method then comprising a step of updating said at least one encoding table following the coding of said value to be coded. The compactness and efficacy of the coding of the structured document is then increased.

It should be noted here that the encoding tables may be the coding dictionaries as mentioned previously, if the latter explicitly contain the coding values used in the final bitstream rather than only the symbols associated with the entries, symbols that it is necessary to code next.

In combination with the coding of values of the structured document, the coding of the structure information of this same document is carried out.

Thus provision is made, in one embodiment, for said structured document to comprise structure data to be coded, and the method then comprises the following steps for coding a structure data item:
the prediction of at least part of the information forming said structure data item, from a coding grammar;
if the prediction is positive, the encoding of a so-called "conformity" information representing this positive result, and the encoding of the other information of said structure data not included in said predicted part.

Thus the number of coded bits used can be reduced compared with the conventional methods of coding the priorities of productions for example.

In particular, a plurality of predictions is made for successive structure data, said method then comprises:
a step of determining whether there exists a succession of correct predictions for structure data, and
if the result of said determination step is positive, a step of coding the number of successive correct predictions.

The compactness of the coding is thus improved.

In particular, when a prediction for a structure data item is positive, the encoded data corresponding to said other information is recorded in a buffer and, when a prediction is negative, said step of coding the number of successive correct predictions is performed and said encoded data stored in the buffer is copied.

All the data necessary for the reconstruction, on the decoder side, of the structure of the XML file for example has thus been encoded.

Correspondingly, the invention also relates to a system of coding a structured document comprising values to be coded, the system comprising means for coding, using at least one indexing dictionary comprising entries, at least one value to be coded, a means for identifying at least one entry value of the dictionary linked to the value to be coded by a match between at least part of one of these two values and a subpart of the other value, and wherein the coding means are able to code said value to be coded by reference, according to said match, to at least said identified entry of the dictionary.

Optionally, the coding system may comprise means relating to the characteristics of the coding method disclosed previously.

The invention also relates to a method of decoding coded data, forming for example a coded bitstream, of a structured document into decoded values, the method comprising a step of decoding the decoded data using at least one decoding dictionary comprising entries, wherein said decoding comprises the following steps:
identifying, in said coded data, and decoding at least one item of reference information linking the value of an entry in the decoding dictionary to a decoded value corresponding to the coded data by matching between at least part of one of these two values and a subpart of the other value;
recovering said part or said subpart of the value of the entry from said decoded reference so as to form, at least partly, the decoded value.

In a similar fashion to the coding, either all the coded data of a value forms a reference to a subpart of an entry in the dictionary; or several parts of the coded data make it possible to form several subparts of the decoded value.

In the latter case, it is understood that, in order to decode all the coded data corresponding to the decoded value, it is necessary to proceed, either in the same way or in a conventional fashion, with the decoding of the other parts of said coded data.

Thus the decoding of a new value is based on the values already decoded or present in the dictionary without for all that being equal thereto. By using references based on common character substrings, the size of the dictionaries or decoding tables, and therefore the resources used, is thus reduced.

Optionally, the decoding method may comprise characteristics that are images of those relating to the characteristics of the coding method disclosed previously.

In addition, in one embodiment, said decoding of the coded data corresponding to the decoded value comprises a succession of partial decodings of parts of said coded data in order to form decoded subparts of the decoded value and the concatenation of said subparts so as to form said decoded value, each partial decoding comprising one from among:
said identification and decoding of reference information followed by said recovery; and
direct decoding of at least one character.

In one embodiment, a plurality of coded data corresponding to a plurality of other decoded values of said document, generally those preceding the value to be decoded within the meaning of the document, is identified and stored in said dictionary, prior to said decoding of the coded data corresponding to the decoded value, and said recovery comprises the decoding of the coded data associated with the referenced entry.

Thus, when it is wished to access only part of the structured document, the coded data at the start of the document is only decoded when it is useful for the part (that is to say referenced by this part) to be accessed. The decoding of the structured document is thus partial, faster and requires fewer resources.

One alternative consists of decoding each of said coded data as the coded bitstream is read and recording the decoded values in said dictionary.

Thus the invention also relates to a method of accessing a part of a structured document comprising the decoding of said document as mentioned above, wherein a plurality of coded data is identified and stored corresponding to decoded values situated, in said document, before said part to be accessed, and said part to be accessed is decoded, said decoding of the part to be accessed comprising, for at least one coded data of said part to be accessed, said identification and decoding of reference information followed by said recovery.

Returning to the decoding method, according to another embodiment the method comprises a step of determining, in said coded bitstream, said coded data corresponding to a decoded value by means of at least one indication indicating the end of said coded value.

Correspondingly, the invention also relates to a system of decoding coded data of a structured document into decoded values, the device comprising means of decoding the coded data using at least one decoding dictionary comprising entries, wherein the decoding means comprises:

a means of identifying, in said coded data, and decoding at least one item of reference information linking a value of an entry in the decoding dictionary to a decoded value corresponding to the coded data by matching between at least part of one of these two values and a subpart of the other value;

a means of recovering said part or subpart of the value of the entry from said decoded reference so as to form, at least partly, the decoded value.

Optionally, the decoding system can comprise means relating to the characteristics of the decoding method disclosed previously.

An information storage means, possibly totally or partially removable, readable by a computer system, comprising instructions for a computer program adapted to implement the coding, decoding or access method according to the invention when this program is loaded into and executed by the computer system.

A computer program able to be read by a microprocessor comprising portions of software code adapted to implement the coding, decoding or access method according to the invention when it is loaded into and executed by the microprocessor.

The information storage means and computer program have characteristics and advantages similar to the methods that they implement.

The present invention is thus beneficial in terms of compression of the XML document content information, which often constitutes the major part of the data of the document.

The invention also offers benefits in terms of speed and memory performance, in particular by allowing the encoding and decoding on the fly with an appreciably gain in compression without increasing the memory use, since the dictionaries are constructed by the underlying binary XML format and are therefore not specifically constructed for encoding by referencing.

The invention also allows a partial decoding of the document that is faster than in the prior art and using less memory. This is because some of the data can be stored in compressed form.

Finally, another advantage of the invention lies in the compatibility of the encoding/decoding proposed with the underlying binary XML formats, such as Fast Infoset and EXI, so that the additional cost for implementing the invention is limited to a new codes (coder-decoder) only.

Other particularities and advantages of the invention will also emerge from the following description, illustrated by the accompanying drawings, wherein:

FIG. 1 depicts an example of an XML document to be encoded;

FIG. 2 illustrates the coding of the values of the document in FIG. 1 according to the conventional techniques of the prior art;

FIG. 3 illustrates the coding of the values of the document in FIG. 1 according to the method of the present invention;

It is intended to illustrate first of all the contribution of the invention for the encoding of the XML document proposed in FIG. 1. This XML document comprises three "person" elements each having three child elements "firstname", "lastname" and "city" provided with a text field.

Although the invention is illustrated here by the encoding of text fields, it is understood that the invention applies to the encoding of any value that is conventionally carried out via index tables: prefixes, URIs, attribute and node values, local names of attributes and nodes, qualified or non-qualified names, etc.

FIG. 2 shows the coding of the character strings by reference to an index, according to the prior art, and in FIG. 3 a differential coding of the character strings by means of the present invention.

Conventionally, the second occurrence of "Liverpool" uses the identifier allocated to the first value of "Liverpool".

From known techniques, it is also clear that the redundancies between "Mary" and "Mary Lisa" are not used, just like the redundancies between "London" and "Londasle".

On the other hand, in FIG. 3 illustrating the present invention, the taking into account of the inter-string redundancies (underlined) and the new way of representing them have been shown. The string "Mary Lisa" thus references the string "Mary" and the string "Londasle" references the first 4 characters in the string "London".

The mechanisms of the invention for ending up with such a result are now illustrated, in particular with reference to FIGS. 4 to 11.

Figure 4:
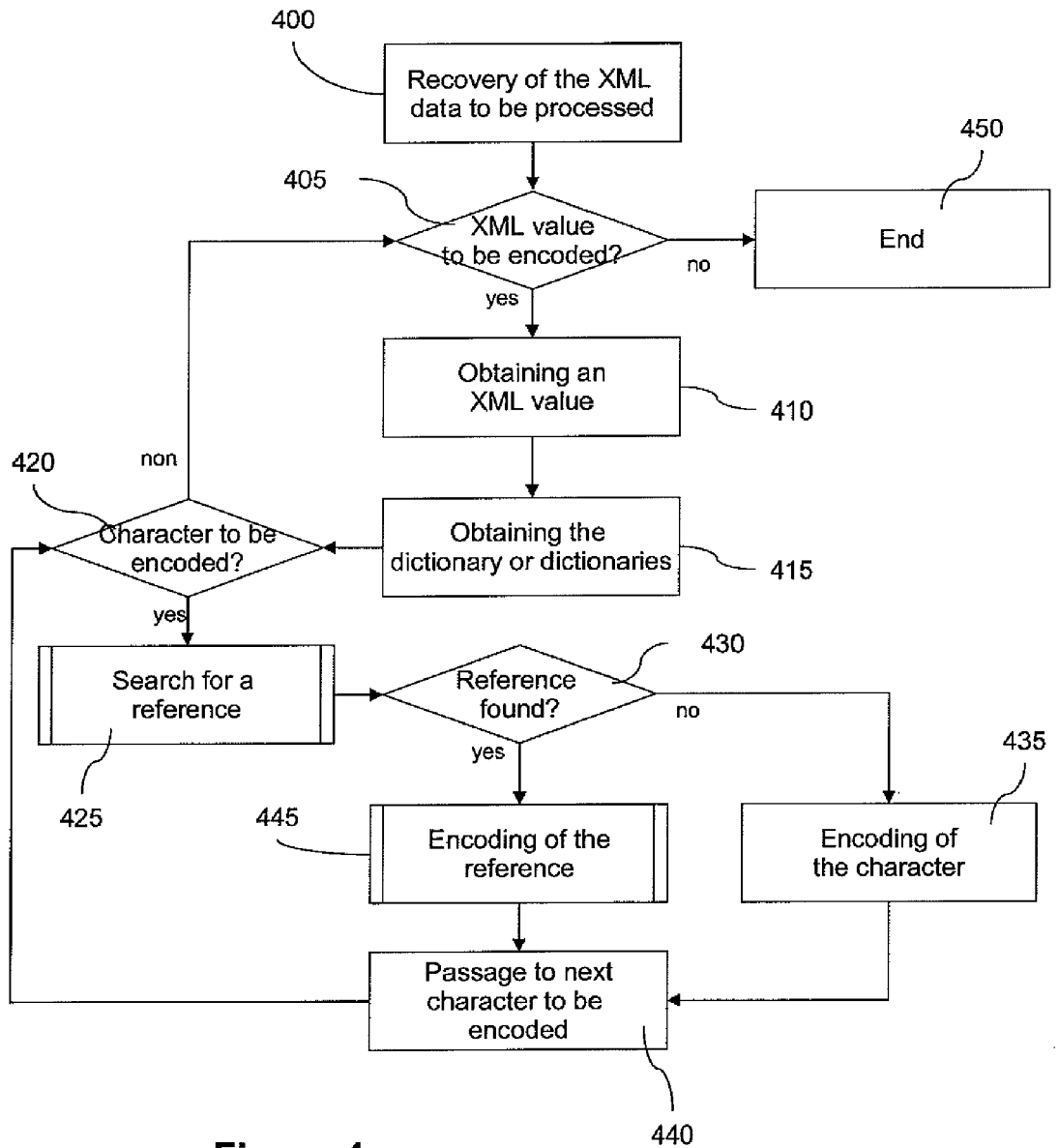
FIG. 4 illustrates the general encoding algorithm according to the present invention.
Figure 5:
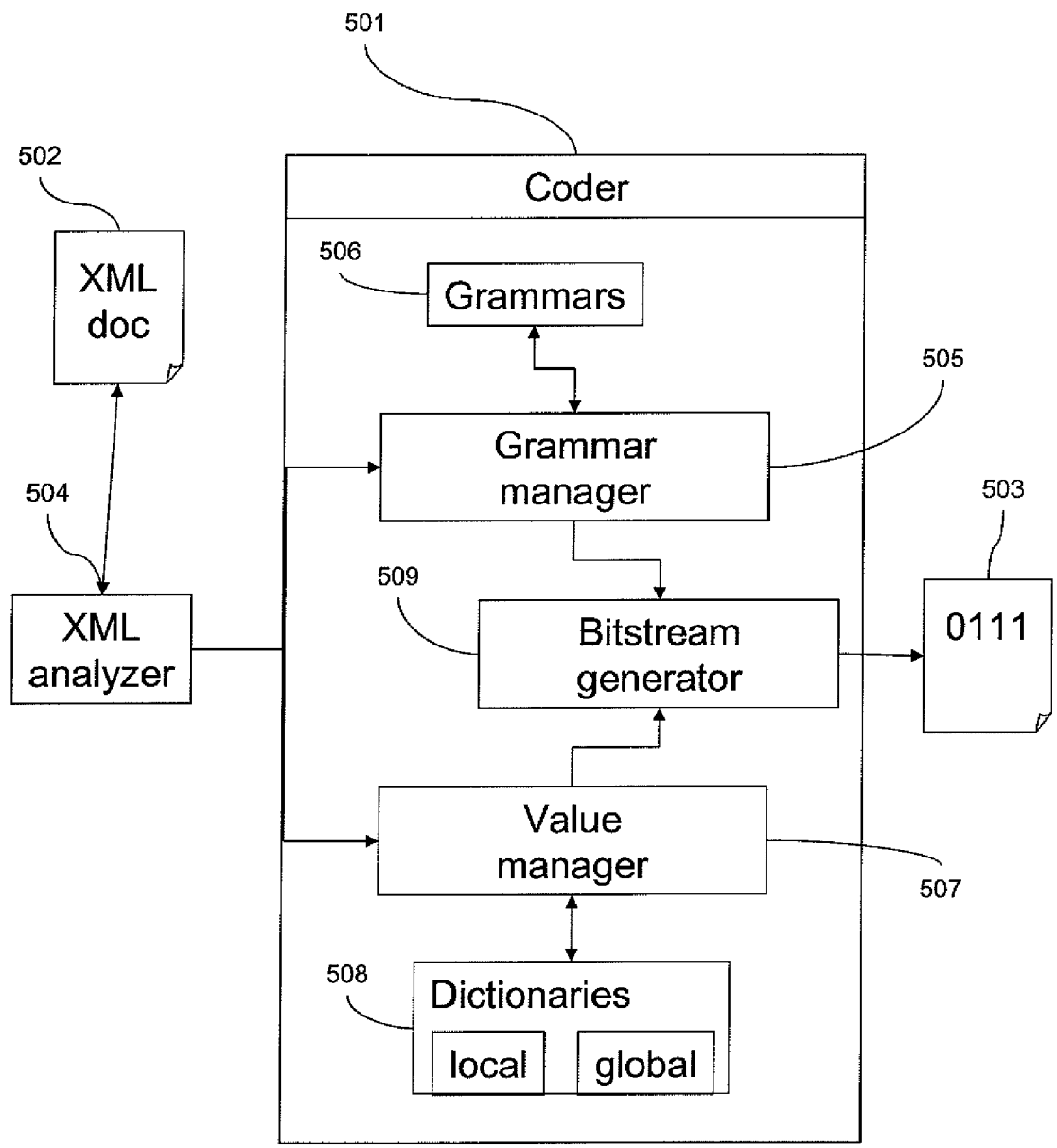
FIG. 5 is a schematic representation of an encoder for implementing the algorithm in FIG. 4.

FIG. 4 illustrates the general encoding algorithm according to the present invention. This algorithm is in particular used in a module called a coder 501, illustrated by FIG. 5.

The encoder 501 takes as an input a document or an XML data stream (502), for example the one in FIG. 1, and generates as an output a document or a stream of binary data (503). For this purpose, the coder 501 uses an XML analyzer 504 responsible for extracting and identifying XML events in the XML document 502. It also has a module 505 for managing grammars 506 and productions as defined for example by the efficient XML standard. This manager is also responsible for the encoding of the priorities associated with the various productions of the grammars 506.

Also, the coder contains a management module 507 for the dictionaries of values 508. This value manager 507 inserts and recovers values in the dictionaries. It also takes responsibility for the coding of the indices representing the index values as well as the coding of the values not yet present in the dictionaries 508.

Finally, a bitstream generator 509 is responsible for recovering the various encoded data and inserting them as they are produced in the output bitstream 503.

Returning to FIG. 4, the encoding begins by recovering XML data 502 to be encoded at step 400. When these data 502 is encoded, an XML value may be encoded. An XML value may be an attribute value, a text node value, an XML element name, a namespace URI, a prefix, a comment value etc, generally a character string.

It is tested whether an XML value is to be encoded at step 405. If it is the case, the value manager 507 recovers this value at step 410 and recovers the dictionary or dictionaries to be used for encoding this value at step 415. Several recoveries are possible according to the underlying binary format. In general one or two dictionaries are recovered.

Thus, in the EXI format, it is possible to recover, for an element or attribute value, the dictionary local to the element/attribute and the global dictionary of values. For a local element, it is possible to recover the table of local names. In the case of the Fast Infoset format, the table of the namespace URIs is recovered in order to encode a namespace URI.

It should be noted that it is also possible to partition a dictionary into two or more sub-dictionaries, the aim being to allow better subsequent encoding of the references to these dictionaries, as will be seen with reference to FIG. 7 below.

Thus, for Fast Infoset and EXI, it is possible to define, for a local element name, a subset of the dictionary of the local names by adopting a set composed of the local names of the parent elements of the element to be encoded. This partitioning may also consist of using a local dictionary of another element, the partitioning then being based on a step of detecting redundancy of information between the two dictionaries, this step being able to be performed during the encoding or previously during the configuration of the encoder after having carried out statistical analyzes.

Once the dictionaries are recovered, the value manager 507 proceeds with the proper encoding of the value. This step begins by testing whether there remains a character of the value to be encoded at step 420.

If this is the case (output YES at step 420), a reference search is carried out on the value from the character to be encoded at step 425. This step is detailed subsequently with reference to FIG. 6.

Following this search, it is tested whether a reference has been found at step 430. If this is not the case (output NO at step 430), the character of the value is encoded at step 435, and then the following character to be encoded is passed at step 440.

If a reference has been found (output YES at step 430), this reference is encoded at step 445. This encoding is described by FIG. 7 below. Next the following character to be encoded is passed at step 440. It should be noted that step 435 has allowed the encoding of several characters and that step 440 has of course skipped these characters.

When all the characters of the XML value have been encoded (output NO at step 420), the encoding of the value ends with the encoding of the end of value and it is possible to pass to the following value at step 405.

It should be noted here that, to allow complete decoding of an XML value, as will be seen subsequently with reference to FIG. 9 for example, the coder inserts a special symbol ("end of value") indicating the end of the binary data corresponding to this value. This symbol can, without its being limitative, take the following forms:

- the encoding of the number of bytes used for encoding the value;
- the encoding of the number of characters of the value;
- the encoding of a particular symbol, typically 0 at the end of the value.

The first alternative has the advantage of making it possible to very rapidly skip the decoding of a value if it is not useful. The third alternative makes it possible to encode the end of an XML value adaptively (via a particular code). It is also possible to envisage integrating the search for this end symbol in the reference search step, in which case the end symbol is sometimes encoded by means of a reference.

When all the XML data and values have been encoded (output NO at step 405), the encoding process ends at step 450.

Figure 6:
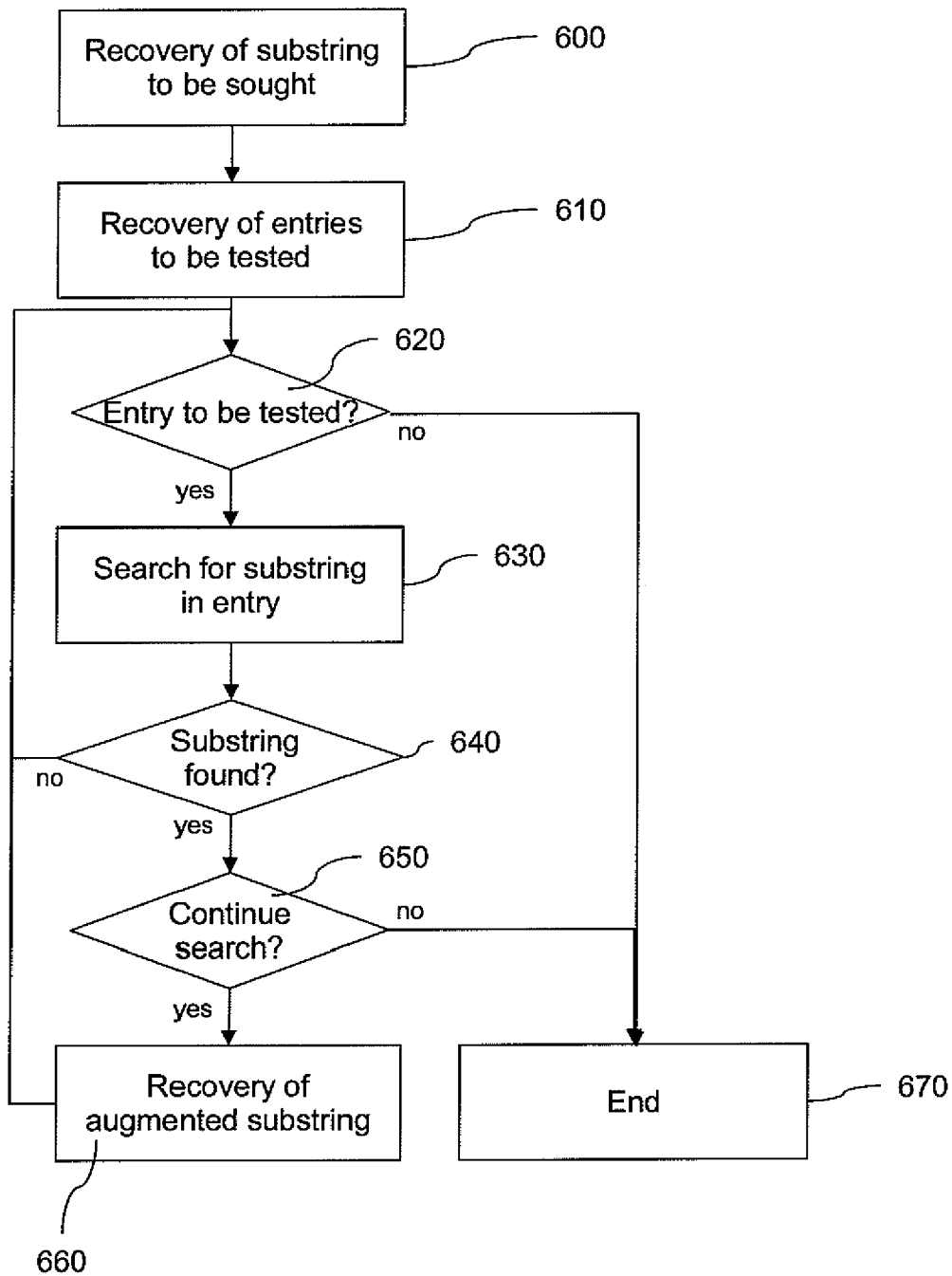
FIG. 6 depicts, in the form of a logic diagram, steps of searching for references used in the process in FIG. 4.

The step 425 of searching for references illustrated by FIG. 6 is now described in more detail.

In general terms here, the search for a reference corresponds to the search for a substring belonging both to the XML value to be encoded and to a value already present in a dictionary of XML values. Several approaches are possible, based on substring search algorithms, for example the Rabin-Karp or Knuth-Morris-Pratt algorithms. The possibility of using the Boyer Moore algorithm for an effective search can also be noted.

The general reference search algorithm of FIG. 6 is based on a substring search algorithm. The algorithm used by the value manager 507 begins by recovering a substring to be sought at step 600. Typically this substring is extracted from an XML value to be encoded. The first step is to search for a short XML substring, typically three characters.

At step 610, the strings from which the search is made are recovered. These strings (hereinafter referred to as entries) are recovered from the dictionaries obtained at step 415. It is also possible to include in this search the part of the XML value that is already encoded. If a reference is found from the already encoded part of the XML value, the term "internal reference" will be used subsequently.

Next, the search for the substring for each entry is iterated.

It is checked whether there is an entry to be tested, at step 620. If in the affirmative, this entry is recovered and the search for the substring is made in the entry, at step 630, using for example the Boyer Moore algorithm. It is then tested whether a substring has been found at step 640. If this is not the case, the search is made with the following entry.

If a substring has been found (output YES of step 640), a test for stopping the search is made at step 650. This search may be stopped (step 670) if the result of this search is judged to be sufficient, for example if the substring is of a large size. It is also possible to stop the search if the time passed is too great. A learning of the stop criterion is also possible: this criterion may be global to all the XML values or local for each set of values of such and such an element/attribute. It can thus be decided to test only the entries in the local dictionary. It is understood that this stop test is optional and that it can be envisaged pursuing the searches as long as a substring of an entry can be found.

In the case where the search may continue either because no test is made or because the test is negative (output YES of step 650), the size of the substring sought is increased by one or more characters at step 660 and the search is continued on the entries not yet tested. During step 660, the search is ended in the current entry of the substring while increasing it if necessary.

Once all the entries have been tested (output NO of step 620), the search is ended at step 670. The last substring found is that rendered at the output of step 425.

In this process, as soon as a reference is found, the search substring is increased. This makes it possible in particular to limit the search and the associated processing time.

In a variant, it is nevertheless possible to continue the search until the end of the dictionary in question before increasing the substring. There is then if necessary a choice between several entries.

This process in FIG. 6 is illustrated by the following example:
 the dictionary comprising the entries: "marie", "voile", "voiturette" and "car" is available;
 there is the value "voiture de marie" to be encoded;
 he first step is a search on the substring "voi" (step 600);
 the first entry "marie" does not have this substring;
 the second entry "voile" has this substring;
 the substring is then increased by a character "voit" (step 660);
 the second entry "voile" does not have this substring (still step 660);
 the third entry "voiturette" has this substring;
 the substring is increased successively by the characters "u", "r" and "e" until the reference "voiture" is obtained, which is found in the third entry;
 the following substring increased by the space " " is then sought. This substring "voiture" is not found in the second entry "voiturette";
 the fourth entry "car" does not have this substring;
 the reference found is then "voiture" and the end of the value to be encoded still has to be encoded, that is to say "de marie" which, in the example, will be encoded character by character for "de", and then with reference to the entry "marie" for the end.

As will be seen subsequently for the encoding of the reference to the third entry, in our example the following series of symbols to be encoded is obtained:
 Reference (3,0,7) "de" Reference (1)

Various approaches for encoding these symbols can be proposed.

It is possible to have fixed encodings by means of fixed Huffman tables for example.

It is also possible to envisage that the encoder 501 and the decoder 801 have a predefined set of Huffman tables and that the encoder determines the Huffman table used.

It is also possible, in the ZIP compression format, to define, in the bitstream, the Huffman table to be used. These various methods have the advantage of allowing rapid decoding, independent of the position of the encoding, which may be practical when, for example, it is desirable to decode a value once the whole of the document is decoded.

It is also possible to envisage using an adaptive Huffman algorithm, in which case statistics recovered during the encoding of the values and used progressively for improving the efficacy of the Huffman table are kept. It is thus possible to decide to update the Huffman table after the encoding of each symbol (step 440) or after the encoding of each value (step 410).

In a variant, it can be noted that the same reference can sometimes be found in several entries by the process. In this case, various selection criteria can be applied:
 a compression criterion. In this case, the references that are encoded more effectively are advantaged: recent entry, of small size, start or end reference, as will be seen below with reference to FIG. 7;
 a decoding speed criterion. In this case, the oldest entry is used so that references of identical substrings point systematically to the same entry, thus allowing minimal partial decoding, as will be seen subsequently with reference to FIG. 10;
 a proximity criterion, be means of which the entries coming from a local dictionary are favored.

Figure 7:
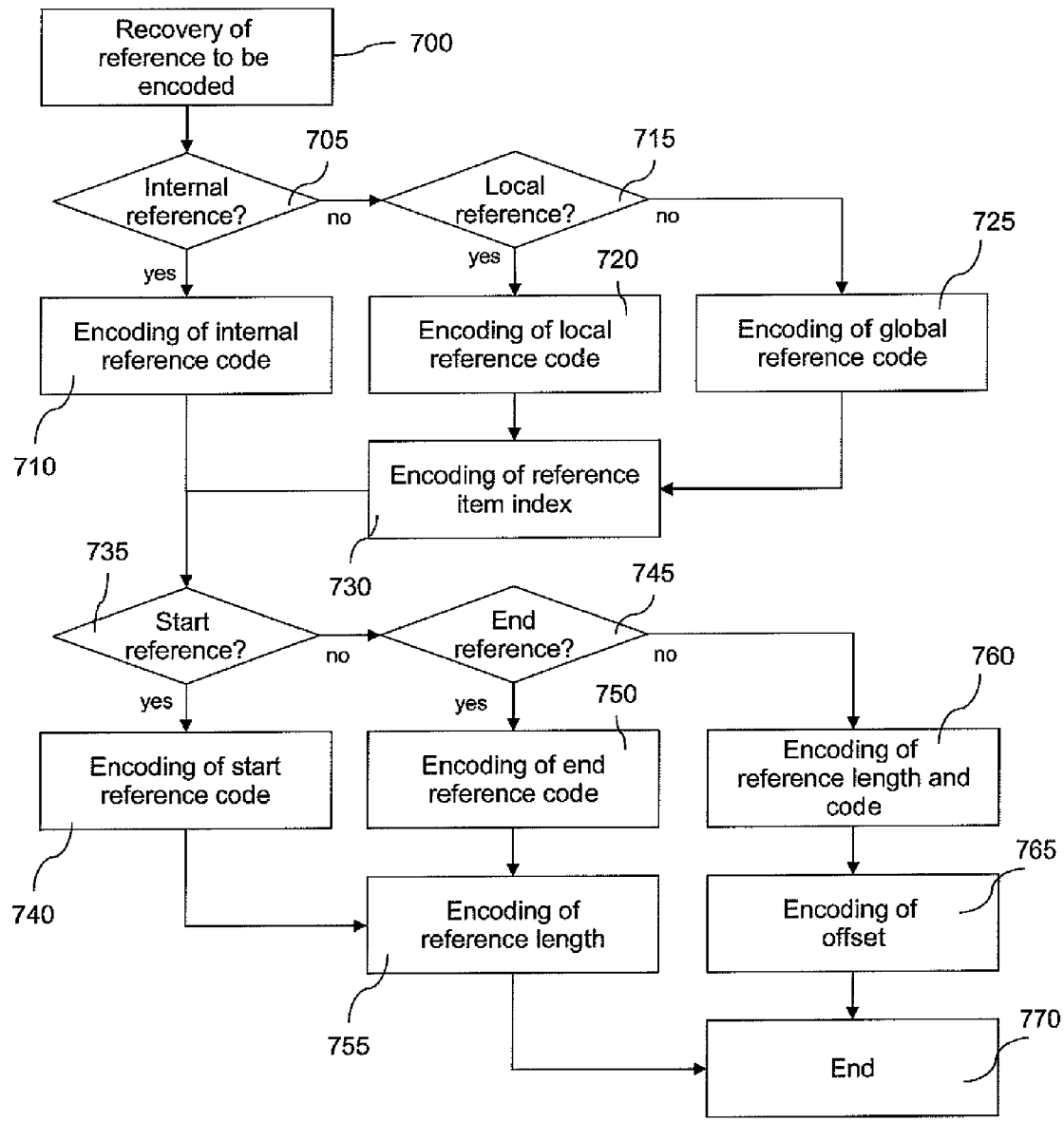
FIG. 7 depicts, in the form of a logic diagram, steps of encoding a reference obtained following the steps in FIG. 6.

A description is now given in more detail of the step 445 of encoding the references found previously, illustrated by FIG. 7.

The algorithm for seeking references produces, as seen above, a series of symbols that are encoded by coding methods such as a Huffman coding or arithmetic coding for example. These various methods are based on knowledge of the appearance probabilities of the various symbols to be encoded. To allow encoding on the fly, the probabilities are either known in advance (static approach with predefined tables) or updated progressively during the encoding (dynamic tables), as explained above.

The algorithm for encoding references represented in FIG. 7 is based on these coding methods while taking into account the specificities of the data to be encoded, in particular the index, the length and the offset of the reference.

The encoding begins at step 700 by recovering the reference produced at steps 425 or 670, in order to determine the type of reference.

First of all it is determined at step 705 whether it is a case of an internal reference, that is to say based on another substring of the same value to be encoded.

In the affirmative (output YES of step 705), a code indicating that it is a case of an internal reference is encoded at step 710.

In the negative, if it is a case of a local reference (tested at step 715), that is, the referenced XML value is indexed in the local dictionary, the corresponding symbol is encoded (indicating that it is a case of a local reference), during step 720, by means of a conventional coding technique, such as an arithmetic coding or a Huffman coding.

Otherwise (output NO of step 715), it is a case of a global reference and the symbol "global reference" is encoded at step 725.

In the case of a local or global reference (after 720 and 725), the index value of the reference within for example the associated dictionary is encoded at step 730.

In order to limit the number bits used for encoding this index, it is possible to carry out this coding in a simple manner by encoding the index in relation to the size of the dictionary: for a dictionary having for example 213 entries, 8 bits are used, while with a dictionary having 8 entries only 3 bits are used.

In a variant it is also possible to define ranges of indices, calculated from the size $T_i$ of the dictionary "i": the first indices from 0 to $T_1-1$ are allocated to a first dictionary 1, then the indices from $T_1$ to $T_1+T_2-1$ to the second dictionary, etc. Thus the range in which the index is situated can easily be determined. In this case, the index is encoded in relation to the range: the range defining a minimum index ($I_{min}$) and maximum index ($I_{max}$), then the index I is encoded by encoding the value ($I-I_{min}$) in relation to the value ($I_{max}-I_{min}$). This approach makes it possible to minimize the number of bits used for encoding the index.

In this case, it is necessary to indicate in the encoded stream to which range the coded differential index relates. It is possible to provide the direct indication of the dictionary used.

In a variant, codes are defined that determine jointly the type of reference and the range of indices (when it is a case of a local or global reference). In this case, the following codes are provided:
- a code for a new character to be encoded;
- as many codes as there are characters previously encoded;
- several codes for the local reference symbol, each code defining a range of indices;
- several codes for the global reference symbol, each code defining a range of indices.

The hypothesis underlying this approach is that the XML values having a recent index have more chance of being referenced than the old XML values. This property can in particular be amplified by the search that can be done from the most recent values to the oldest values. Taking this hypothesis, it is then possible to define intervals of small size for the recent values and of large size for the old values. It is then possible to determine the ranges proportional to the size of the dictionary and to attempt obtaining interval sizes of the power of 2 type, in particular for the small intervals.

At the end of steps 710 and 730, the identifier of the dictionary and the index of the entry of the reference, where applicable, have been encoded and all that remains is to indicate to which substring of the entry the reference corresponds, that is to say to encode the length and offset values.

It will be observed at this stage that there exists great redundancy either at the start or at the end of the XML values. This is because it is conventional to use spaces at the start or end of values, just as it is conventional to use prefixed names.

By way of example, the designer of an XML document listing an address book generally uses element names prefixed by the term "address". Thus there is in this document a strong recurrence for elements such as <addressBook>, <addressEntry>, <addressName>, and the corresponding end of tag elements </addressBook>, etc.

With regard to the offset, various categories of reference can be distinguished:
- references of the start type when the substring begins at the first character of the referenced entry, which is the case in the above example;
- references of the end type when the substring finishes at the last character of the reference entry; and
- all the other references comprising neither the first nor the last character of the referenced entry.

With regard to the length of the substring, it should be noted that, generally, short references are much more frequent than long references.

Thus, to allow effective adaptive coding of the offset and length, the following set of codes is provided:
- a "start reference" code, used in the first category above;
- an "end reference" code, used in the second category above;
- a "length=N" code, a "length=N+1" code, ..., a "length=N+M" code;
- a "great length" code, naturally in the cases where the length of the substring is greater than N+M, with which generally an indication of the additional length beyond N+M will be associated.

The value N corresponds to the minimum substring, that is to say N=3 in the example proposed above (see step 600). In practice, a small value of M is typically taken, for example M=3.

It is then possible to carry out an adaptive coding of these various codes as their occurrences arise.

It is also possible for the codes used above to be allocated statically and aligned on a byte (therefore codes with a length of 8 bits), which facilitates the decoding byte by byte (which is then scarcely slower than in the absence of compression) rather than bit by bit.

The encoding of the length and offset values is then proceeded with by testing first of all, at step 735, whether it is a case of a reference of the start type. If such is the case, the "start reference" code is encoded at step 740.

Otherwise (output NO of step 735), it is tested whether it is a case of a reference of the end type at step 745. If this is the case, the "end reference" code is encoded at step 750.

Following steps 740 and 750, which allowed the encoding of an item of offset information, the length of the reference is encoded (in the case of a reference of the end type, it is possible to deduce the offset from the lengths of the value and from the reference) at step 755 using for example the length codes provided above.

It is possible to encode the reference length in relation to the maximum possible value of this length. In practice, statistical studies show that the probability of appearance of the reference lengths decreases rapidly with the value of the reference length. It is then also possible to decide to encode this length using an encoding such as the "exponential Golomb", which greatly favors small values to the detriment of high values.

In this way the start and end references have been coded and this reference coding is ended at step 770, so as to continue at step 440.

If it is not a case of a reference of the start type or a reference of the end type (output NO of step 745), then the reference length is encoded directly at step 760 by means of the appropriate length code.

In the case of a reference of length L greater than N+M, the "great length" code is encoded and then the value (L−N+M) by means of an encoding such as the exponential Golomb.

In a variant, it is possible to successively use the above length codes for indicating the total length. For example, the succession of "great length", "great length" and "length=N+1" codes corresponds to the length (N+M)+(N+M)+(N+1) =3N+2M+1.

Next the value of the offset is encoded at step 765, corresponding to the distance between the first character of the referenced entry and the start of the substring found. It is once again possible to carry out an adaptive coding of this value, for example by adapting the encoding according to the value of the reference length. However, the distribution of the offset being relatively uniform, this value is generally encoded relative to the maximum offset value calculated from the lengths of the value and the reference.

According to a characteristic aimed at optimizing this encoding, a set of possible positions in the value of the referenced entry is determined, these positions depending on various criteria such as punctuation, capital letters, or a space. Thus the value of the offset is encoded relative to this set of positions. The algorithm for selecting the positions may be similar to an algorithm for separation into word syllables.

Two examples are given below where the underlined letters are the selected positions:

"listNumberTarget"→"listNumberTarget"
"this is an example"→"This is an example"

In this way the references that are neither start nor end have been coded, and the reference coding is ended at step 770, so as to continue at step 440.

As an alternative to this encoding method where each of the items of information of the reference, reference index, length and offset type are encoded, it is envisaged using a reference dictionary, that is, a dictionary where each entry associates an index with a reference composed of the information numerated above.

Thus the encoder 501 stores the current dictionaries and adds such a dictionary of references storing the reference information. Then the encoding of the reference at step 445 takes place in an indexing manner with indexes to this dictionary or directly in a standard fashion if the entry does not yet exist in the dictionary (in which case a new entry is added to the dictionary).

In this case, the decoder also constructs this dictionary of references along with the decoding.

It should be noted that the encoder 501 can also use such a dictionary of references in order to accelerate the search for references (see FIG. 6) without however using it with regard to the proper encoding of the references. This last possibility reduces the encoding time whilst limiting the memory resource requirements of the decoder.

Not shown by the figures, the encoding of the typed values of an XML document can be slightly improved. Since no dictionary is generally constructed during the standard encoding of such typed values because of the specialization of this encoding, it is difficult to integrate the system of references mentioned above directly in the typed encoding.

Nevertheless, it is possible to make provision as required:
to integrate typed values in one or more dictionaries, and therefore to apply the present invention also to these typed values;
to add a floating buffer for processing these typed values. The typed values are encoded and sent as series of bytes and are also stored in this floating memory, in which case the search for references applies to this floating memory instead of or in addition to the dictionary.

With these two possibilities, it is then possible to make references in order to reduce the redundancy of these typed values.

The encoding of the values of an XML document by means of the method that is the object of the present invention has been seen above. An XML document of this type also comprises structure data, the encoding of which in a parallel fashion is provided for. The combination of the two encodings ensure effective compression of the structured document.

Said encoding can be carried out according to the conventional encoding mechanisms of Fast Infoset or EXI, for example using grammars and associated productions.

In order to improve the compression of the data, it is envisaged generating, from the grammars describing the elements of the XML document, a sequence of events, and to compare this sequence of events with the events to be coded.

For this purpose, the various grammars concerned are considered successively (for example the grammars describing the elements "person", "firstName", "lastName" and "city" in the above example), and the productions having a level 0 priority are listed. It is also possible to establish a succession of productions that are concatenated in the documents by introducing, for example in these, a reference or a pointer to the following production.

In this way the sequence to be coded, for example two consecutive events (structure data), are compared with the sequence generated, without necessarily seeking to have strictly identical events but simply that the information contained in the grammars is indeed verified (that is, the events are of the same type and possess the same name in the case of "start of element" or "attribute" event).

In the case of positive comparison, this is a situation where it is possible to predict, by means of the grammars generated at the current point of the document, the next events.

Thus the result of the evaluation is then encoded in one bit: in the case of positive evaluation (the data is in conformity with the grammars), it suffices then to code the information that is not present in the grammars (for example the values of the textual content events); on the other hand, in the case of negative evaluation, the data is coded in a basic fashion, that is to say by coding the productions and values (as would be done with Efficient XML). In the first case, all the productions have been coded in a single bit with an appreciable gain in compression; in the second case, simply one bit is lost compared with Efficient XML.

In a more efficient embodiment, still using this predictive approach, provision is made for coding the number of successive correct predictions in order to produce an even more compact bitstream: for example, 10 successive correct predictions will be coded in 4 bits, instead of coding one prediction bit ten times (10 bits would then be necessary).

For each correct prediction, it may happen that some information is not predicted (typically, the value of a textual content event or of an attribute), in which case this information is encoded (in accordance with conventional EXI encoding) and stored in a buffer.

When an incorrect prediction is encountered, the number of current correct predictions is encoded, and then the buffered data is copied into the encoded stream, and next the code of the production describing the event for which the production has failed. The number of correct predictions is then reset to zero, and the process resumes.

The decoding method corresponding to the encoding method described previously with reference to FIGS. 8 to 10 is now described.

Various variants have been presented during the description of the encoding and can find their counterpart in the decoding. It will be understood here that, even if not all these variants applying to the decoding are described, a person skilled in the art will know how to transpose them without difficulty.

The decoding method takes place within a decoder 801, which thus comprises the same main internal modules as the coder 501.

Figure 8:
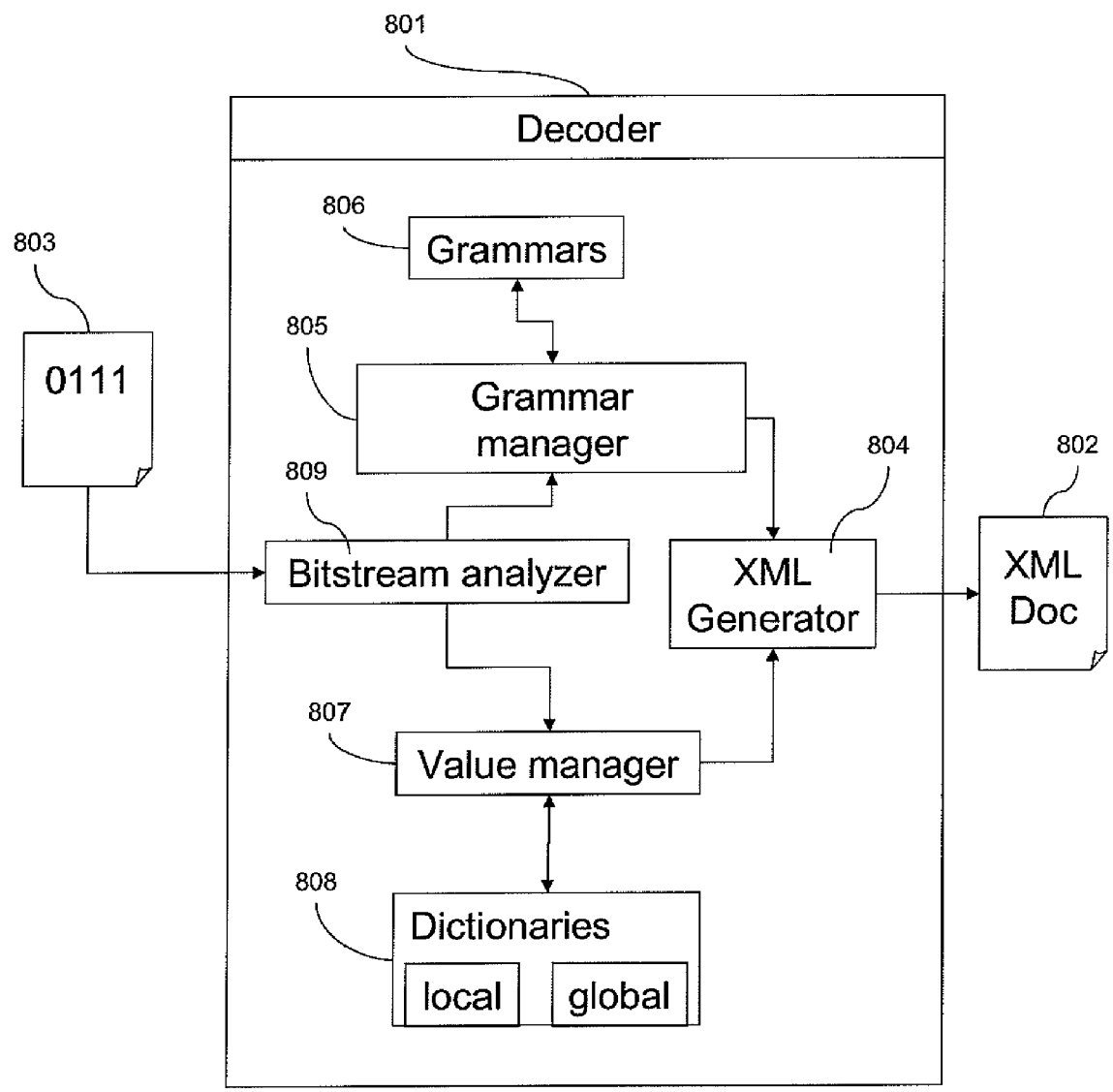
FIG. 8 is a schematic representation of a decoder according to the invention.

With reference to FIG. 8, the grammar 805 and value 807 managers are thus found, as well as their respective grammars 806 and dictionaries 808. However, the data stream is reversed: the entry data is now the coded binary stream 803 resulting at step 450, whereas the result following from the decoding corresponds to the XML document (or data stream) 802. This XML document 802 is generated by an XML generator while the entry bitstream 803 is processed by the binary analyzer 809 that supplies the two managers 805 and 807.

Figure 9:
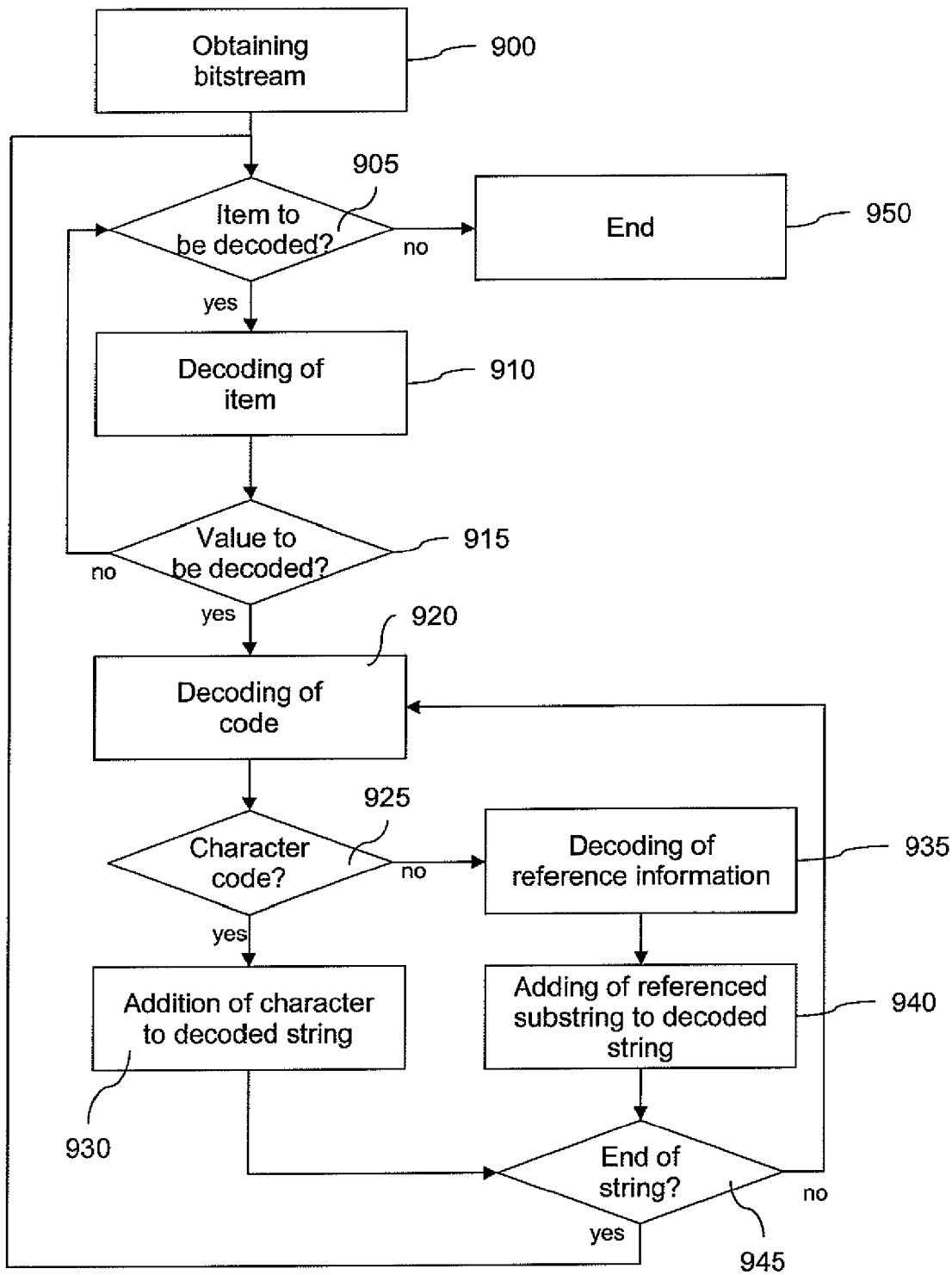
FIG. 9 illustrates the decoding of a coded bitstream generated at the end of the coding according to FIG. 3, decoding according to the method of the present invention.

With reference to FIG. 9, the corresponding decoding method is now described.

At step 900, the decoder 801 recovers the information from the bitstream via the bitstream analyzer 809.

It is next tested whether an XML item is to be decoded, at step 905. If it is the case (output YES), the XML item is decoded at step 910. When all the items are decoded, the method ends at step 950.

This same analyzer can then test, at step 915, whether the item requires the decoding of a value (name of an element, value of an attribute etc). If no value decoding is to be performed, we start again at step 905. This may in particular be the case if the item to be decoded corresponds to structure information. In this case, this item to be decoded is processed in a conventional fashion by the grammar manager 805.

Otherwise (output YES of step 915), the value manager 807 performs the decoding of the value, beginning with step 920.

At this step 920, a code is extracted from the bitstream 903. This decoding may use an arithmetic or Huffman decoding and may or may not require the updating of statistics in a symmetrical manner to the encoding method.

The value manager 807 next determines whether this code corresponds to a reference or to a character at step 925. In the case where the code corresponds to a character, this character is added at step 930 to the decoded string under construction.

If it is a case of a reference (output NO of step 925), the reference information is then decoded (reference code, index, length and offset) at step 935 in a symmetrical manner to the encoding method. This step may require the use of a Huffman decoding, arithmetic decoding and/or the updating of statistics.

Once the reference is fully decoded, the substring referenced in the dictionaries is accessed and then at step 940 the referenced substring is added to the decoded string under construction.

Following steps 930 and 940 of enhancing the decoded string under construction, it is tested whether the string has ended at step 945. This end of string test may be based, as described for the encoding, on the number of bytes read for the decoding of the string, the number of bytes in the string or the presence of an end of string symbol (character decoded at step 930 or character present at the end of the substring).

If the string is not ended, a new code is decoded at step 920. Otherwise the new item to be decoded is passed to (step 905).

Commencing from the first item of the bitstream to the last item, the decoding of the entire bitstream is carried out in this way so as to recover the whole of the XML document previously coded by the method of the invention.

Figure 10:
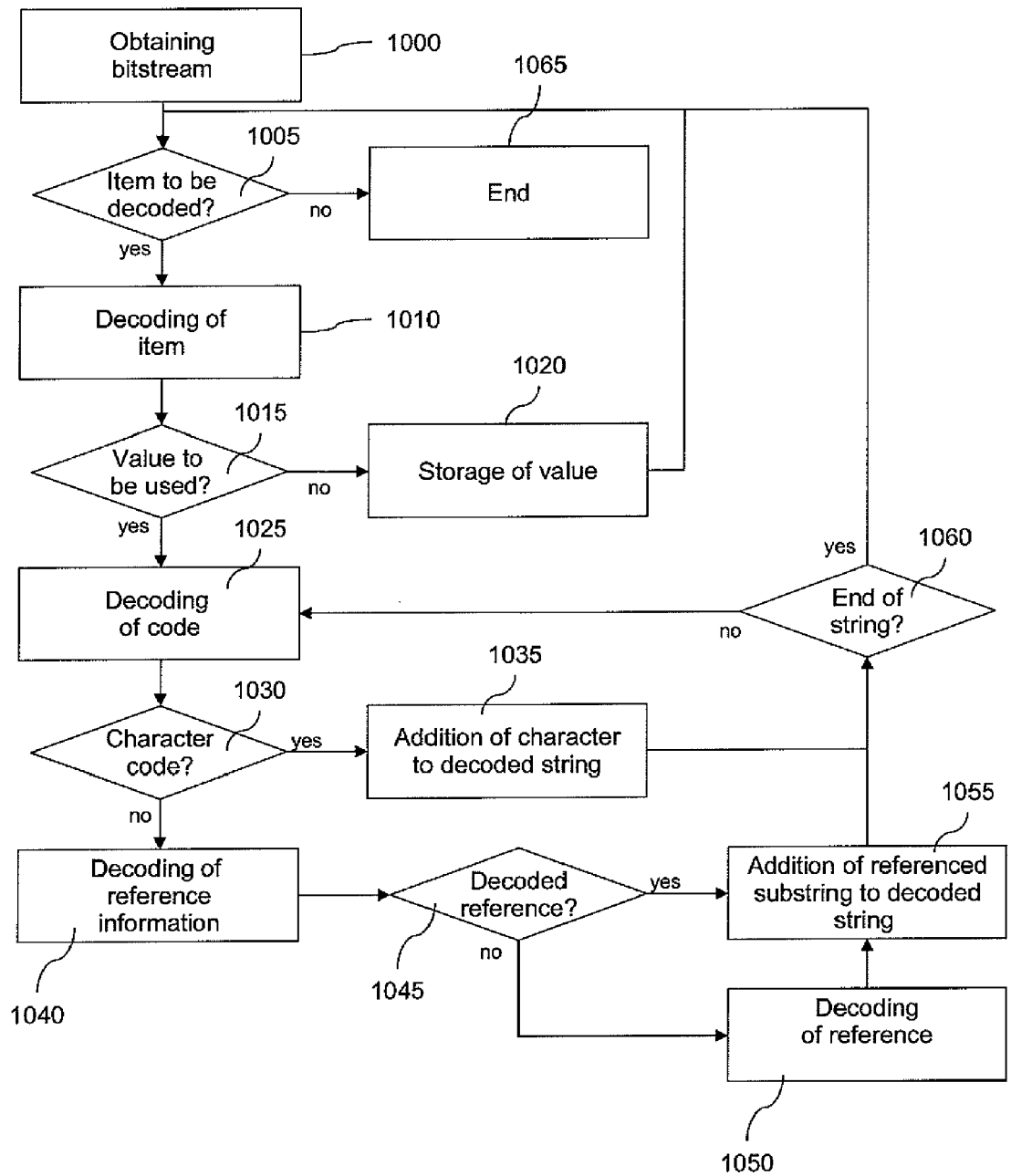
FIG. 10 depicts, in the form of a logic diagram, steps for the partial decoding of an XML document coded according to the invention.

With reference to FIG. 10, there is provided the implementation of a partial decoding, which makes it possible to access only part of the coded XML document without requiring the decoding of the whole of the start of the document.

This approach is particularly useful when only some of the XML data is useful to the application, which is for example the case during a search based on the XPath language (contraction of XML Path Language).

For the record, XPath is a specification defining a syntax for addressing parts of an XML document. This syntax uses a notation similar to the path expressions in a system of files, for example "/list/person/city" for the example in FIG. 1. This syntax serves as a basis for the formation of requests on documents with a view to their conversion, rapid access to subparts or performing processing operations on parts of the document. The main advantage of XPath is simplifying the development of applications called on to navigate in XML documents. The entity responsible for the evaluation of an XPath expression is called "XPath processor". The XPath processor generally accepts as entries on the one hand one or more Xpath expressions and on the other hand a reference to XML data (read in a file or received via a network transmission) on which the expression or expressions must be evaluated.

The partial decoding method begins, at step 1000, with the obtaining of the bitstream.

At step 1005, it is tested whether it is necessary to decode an item. This is indicated by the XPath processor analyzing the XPath expression representing the part of the data concerning the application. It is a case in particular of the items designated by the XPath path but also items that have served to determine the designated items. If this is the case, the value manager 807 performs the decoding of the item at step 1010. It is a case here of decoding, through the item, structure information of the encoded XML document as described previously. In particular, it is possible to recover the "conformity" information informing of a prediction made, and to do this from the current grammars in order to determine this structure information.

At the end of this decoding, the application determines whether a value associated with the item, if there is one, is necessary for the processing, that is, whether it is useful for the determination of the items designated by the XPath expression. This test is performed at step 1015. If the value is not necessary, this value can then be stored in memory, at step 1020. In the case where there is no value, no storage is made and step 1005 is passed on directly for decoding a following item.

The storage of a value depends on various parameters:
 encoding parameters: if the encoding of the codes is dynamic, it is necessary to recover all the statistical information for decoding the future values. If the encoding is static, no particular processing is necessary;
 type of data stream: if the stream is persistent (file), it is possible to keep only a pointer to the data; if the stream is not persistent, the data can be stored in a buffer.

This storage thus keeps the values encountered in a compressed form. The storage 1020 also includes a step of inserting, if necessary, the value stored in the dictionary in order to keep it up to date.

In the case where the value is necessary (output YES of step 1015), the value manager 807 proceeds with the total decoding of said value.

To do this, it begins by decoding the first code of the value at step 1025.

If this code corresponds to a character symbol (step 1030), the character is added to the decoded string in the course of reconstruction.

If this code corresponds to a reference, the reference information is decoded at step 1040. This information makes it possible to recover in particular the entry of the dictionary referenced. It is then tested, at step 1045, whether this dictionary entry is already decompressed or not. If this is the case, at step 1055, the referenced substring is extracted and added to the decoded string. If the entry is not decompressed (output NO of step 1045), the referenced entry is decoded at step 1050 before performing the step of adding the referenced substring (step 1055).

The decoding of step 1050 depends on the storage format used. If the entry has been kept in its compressed form, the same process is performed as the method of steps 1025 to 1060. If the entry has been partially decompressed (shaping of symbols and not of codes for example) the same can be done. A variant of this algorithm consists of integrating steps 1050 and 1055 in order to decode only the part pertinent to the reference. In this case, the encoder 501 will preferably carry out a reference search from the oldest entries to the most recent entries in order to obtain the maximum number of references of the same entry of the dictionary and thus minimize the number of decompressed entries.

Following steps 1035 and 1055, it is checked at step 1060 whether the complete decoding of the string has ended. If this is not the case, the decoding of the following code is carried out at step 1025. Otherwise the test of step 1005 is passed to, which determines whether the stream has ended or whether the application has recovered all the necessary data.

Once all the required stream is decoded, the processing is ended at step 1065.

In a variant embodiment using a persistent coded bitstream, for example in the form of a file stored locally, it is possible to have dictionary entries which do not to contain the bitstreams corresponding to the encoded values but only a direct pointer to these bitstreams within the stored file. In this way the size of the dictionary is limited.

In this case, the decompression of step 1050 consists, first of all, of seeking the bitstream in the stored file and then decompressing this stream.

Figure 11:
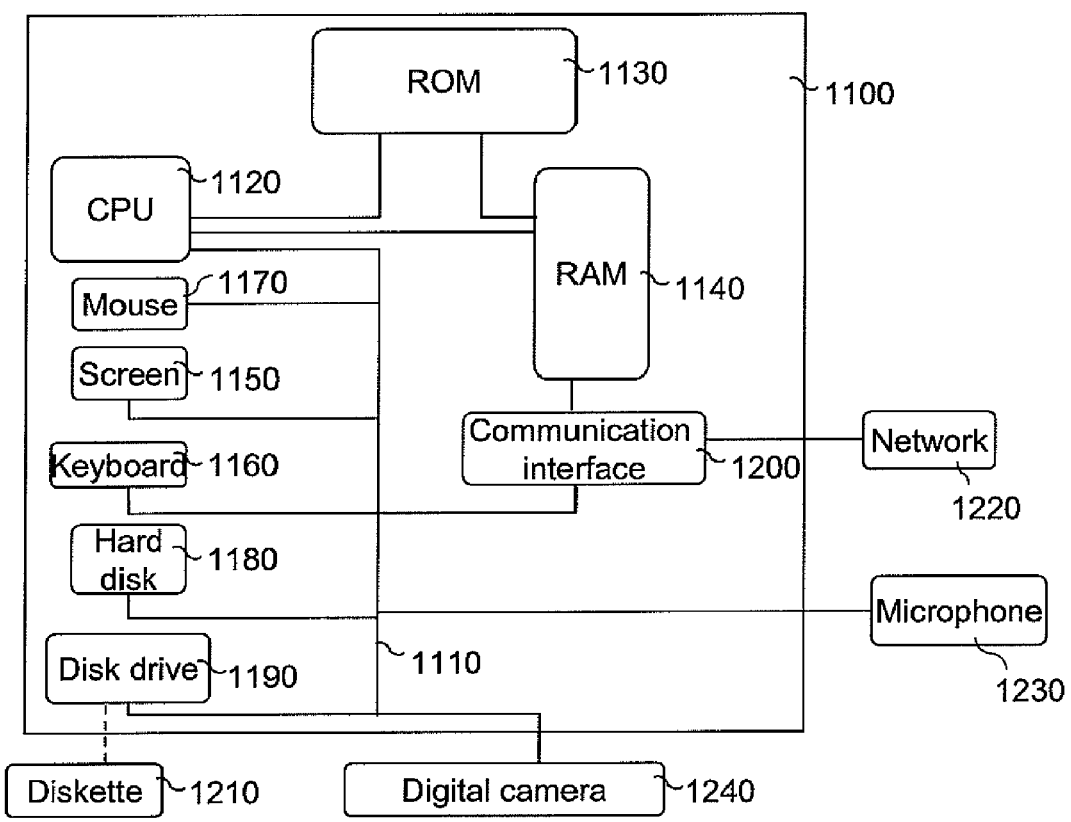
FIG. 11 shows a particular hardware configuration of an information processing device able to implement the methods according to the invention.

With reference to FIG. 11, a description is now given by way of example of a particular hardware configuration of an information processing device able to implement the method according to the invention.

An information processing device implementing the invention is for example a microcomputer 1100, a workstation, a personal assistant or a mobile telephone connected to various peripherals. According to yet another embodiment of the invention, the information processing device is in the form of a photographic apparatus provided with a communication interface for allowing connection to a network.

The peripherals connected to the information processing device comprise for example a digital camera 1240, or a scanner or any other image acquisition or storage means, connected to an input/output card (not shown) and supplying to the information processing device multimedia data, possible in the form of XML documents.

The device 1100 comprises a communication bus 1110 to which there is connected:
- a central processing unit CPU 1120 in the form for example of a microprocessor;
- a read only memory 1130 in which the programs, whose execution enables the method according to the invention to be implemented, can be contained;
- a random access memory 1140, which, after the powering up of the device 1100, contains the executable code of the programs of the invention as well as registers adapted to record variables and parameters necessary for implementing the invention, in particular the tables and grammars of FIG. 1;
- a screen 1150 for displaying data and/or serving as a graphical interface with a user, who can thus interact with the programs of the invention by means of a keyboard 1160 or another means such as a pointing device, such as for example a mouse 1170 or an optical pen;
- a hard disk 1180 or a storage memory, such as a memory of the compact flash type, able to contain the programmes of the invention as well as data used or produced during the implementation of the invention;
- an optional diskette drive 1190, or another removable data carrier reader, adapted to receive a diskette 1210 and to read/write thereon data processed or to be processed in accordance with the invention; and
- a communication interface 1200 connected to the telecommunication network 1220, the interface 1200 being able to transmit and receive data.

In the case of audio data, the device 1100 is preferably equipped with an input/output card (not shown) connected to a microphone 1230.

The communication bus 1110 allows communication and interoperability between the various elements included in the device 1100 or connected thereto. The representation of the bus 1110 is not limitative and in particular the central unit 1120 is able to communicate instructions to any element of the device 1100 directly or by means of another element of the device 1100.

The diskettes 1210 can be replaced by any information carrier such as for example a compact disk (CD-ROM), rewritable or not, a ZIP disk or a memory card. In general terms, an information storage means able to be read by a microcomputer or microprocessor, integrated or not in the information processing device, possibly removable, is adapted to store one or more programs whose execution enables the method according to the invention to be implemented.

The executable code enabling the information processing device to implement the invention can be stored either in read only memory 1130, or on the hard disk 1180 or on a removable digital medium such as for example a diskette 1210 as described previously. According to a variant, the executable code of the programs is received by means of the telecommunication network 1220, via the interface 1200, so as to be stored in one of the storage means of the device 1100 (such as the hard disk 1180 for example) before being executed.

The central unit 1120 controls and directs the execution of the instructions or portions of software code of the program or programs of the invention, the instructions or portions of software code being stored in one of the aforementioned storage means. When the device 1100 is powered up, the program or programs that are stored in a non-volatile memory, for example the hard disk 1180 or the read only memory 1130, are transferred into the random access memory 1140, which then contains the executable code of the program or programs of the invention, as well as registers for storing the variables and parameters necessary for implementing the invention.

It should also be noted that the device implementing the invention or incorporating it can also be produced in the form of a programmed apparatus. For example, such a device can then contain the code of the computer program or programs in a fixed form in an application specific integrated circuit (ASIC).

The device described here and in particular the central unit 1120 are able to implement all or some of the processing operations described in relation to FIGS. 4 to 10, in order to implement the method that is the object of the present invention and constitute the device that is the object of the present invention.

Thus according to the invention the coding and decoding of structured documents such as XML are improved while keeping the advantages of the XML format.

In particular, in the context of Fast Infoset, the invention applies solely to the compression of values, by defining a specific encoding. In this case, the conformity of the stream thus compressed with the ISO Fast Infoset standard is kept.

In a variant, it is possible to envisage compressing the values, local names, prefixes and URIs, in which case conformity with the ISO Fast Infoset standard is not kept, with however a less expensive updating of the standard Fast Infoset implementations in order to accept this new stream.

In addition, it is possible to define vocabularies in the preamble of a Fast Infoset stream and/or to make reference to external vocabularies, for example vocabularies defined in an XML schema. Thus it can be envisaged taking account of these various vocabularies in order to compress an XML document according to the present invention.

In the case of EXI, the encoding of the character strings can be redefined in accordance with the method of the invention by means of the "pluggable codec" functionality, making it possible to keep conformity of the compressed stream with the EXI recommendation.

Finally, Fast Infoset and EXI can rely on prefilled dictionaries, to which reference can be made according to the invention.

As already stated, the invention thus makes it possible to reduce the size of the dictionaries used either because the values fully coded by means of references do not give rise to any new insertion in the dictionary, or because a new insertion in this dictionary for a new value to be coded makes reference to another entry and, because of this, uses a reduced number of information bits in the new entry inserted.

The latter solution will preferably be used in cases where there remains part of the value to be coded which cannot be referenced effectively (for example by means of at least three common characters) by another entry of the dictionary.

In the first coding solution, that is, without the creation of a new entry in the dictionary when a string can be referenced in its entirety, the indication mechanism for the names and values is extended in order to allow effective decoding of the bitstream generated during the coding.

In the case of the EXI standard for example, the signalling mechanism conventionally takes the following form:

for a prefix representing a namespace or the value of this namespace, the encoder generates the code 0 if it is the case of a new value or generates the code ID+1 if it is a case of a value already indexed, where ID represents the entry in the dictionary corresponding to the name of the prefix or to its value;

concerning the local part of the names of elements or attributes, a byte of value 0 indicates that this name is indexed;

finally, concerning the value of a node of the text type or the value of an attribute, a byte equal to 0 indicates that the value exists in the local dictionary of values while a byte equal to 1 is used to indicate that it is situated in the global dictionary.

In the case of the present invention where the coding of values or names does not give rise to the creation of a new entry/new index in the dictionaries, the signalling mechanism presented above is modified in order to take into account not only conventional cases ("indexed value or name", "new name or new value") but also other cases such as for example "value or name able to be coded entirely using a single reference" (for example "Live" when "Liverpool" is indexed) and "value or name able to be coded entirely from several references" (for example "Will Smith" when "Williams" and "Smith" are already indexed, in which case the value is encoded with reference to these two values).

It was seen above that, in the case of "value or name that can be only partially coded from one or more references" (for example "Mary Lisa" when only "Mary" is indexed and "Lisa" must be coded), a new entry is created in the dictionary. In this way a less expensive management of this case is obtained (compared with the absence of any new entry in the dictionary) having regard to the signalling and representation costs for all the parts of the value to be coded.

In detail, for a prefix representing a namespace or the value of this namespace, the encoder generates the code 0 if it is a case of a new value; 1 if it is a case of a "value or name able to be coded entirely from a single reference"; 2 if it is a case of a "value or name able to be encoded entirely from several references" and ID+3 otherwise. All these codes are encoded in a number of bits equal to $2+\log_2(m+1)$ where m is the number of entries in the table.

Concerning the local part of the names of elements or attributes, a 2-bit word is formed so that: the code 00 indicates that this name is indexed, the index is then encoded conventionally; the code 01 indicates that this name corresponds to a "value or name able to be coded entirely from a single reference", the reference then being encoded; the code 10 indicates that this name corresponds to "value or name able to be coded entirely from several references", the number of references then being encoded and then the list of these references; and the code 11 indicates a new name whose length is then encoded followed by its value.

Finally, concerning the values of nodes of the text type or the values of attributes, the same mechanism is used, this time on a 3-bit word: the code 000 indicates that the value exists in the local dictionary of values while the code 001 indicates that it is situated in the global dictionary; the code 010 indicates a "value or name able to be coded entirely from a single reference", this reference then being encoded; the code 011 indicates a "value or name able to be coded entirely from several references", the number of which is first of all encoded before the encoding of each of these references; and the code 100 indicates a new value to be indexed followed by its length and then its value.

These various signalling codes enable the decoder to identify the way of reconstructing a string of coded characters.

The above examples are only embodiments of the invention, which is not limited thereby.

The invention claimed is:

1. A method of coding a structured document comprising items that take at least one string of characters to be coded by substituting a coding index from at least one indexing dictionary for said at least one string of characters to be coded, said at least one indexing dictionary comprising entries, each entry associating a respective coding index with a corresponding string of characters, the method further comprising:

selecting at least one indexing dictionary from among a plurality of indexing dictionaries;

identifying at least one dictionary entry in the selected indexing dictionary whose character string is linked to the string of characters to be coded, by matching between at least a continuous part of the string of characters of the dictionary entry or the string of characters to be coded and a continuous subpart of the string of characters; and coding the string of characters to be coded by reference, according to the matching, to the at least one identified dictionary entry, wherein, said coding by reference comprises coding an identifier of the selected indexing dictionary from amongst the plurality of indexing dictionaries, an item of information identifying said entry identified in the selected indexing dictionary, an item of information on positioning which indicates a first character of the identified entry string of characters that matches the part or subpart of the string of characters to be coded and an item of information on length of the matching part and subpart representing a number of characters of the matching part and subpart;

wherein said indexing dictionaries are distinct from the structured document, wherein the item of information identifying said indexing dictionary selected, the item of information identifying said entry, the item of information on positioning, and the item of length information, are distinct information items, wherein the selected indexing dictionary comprises an entry corresponding to an already coded substring of said string of characters to be coded, so that a subsequent substring of said string of characters to be coded is coded with reference to said already coded substring, and wherein the positioning information is selected from a set comprising a first code when said part or subpart of the string of characters to be coded corresponds to a start of the entry identified, a second code when said part or subpart of the string of characters to be coded corresponds to an end of the entry identified, and an offset value of the position of said part or subpart of the string of characters to be coded in the entry identified, in other cases.

2. The method according to claim 1, wherein said identifying comprises the search for the character string or substring of the string of characters to be coded in a plurality of entry strings of characters of the dictionary.

3. The method according to claim 2, comprising, when identifying comprises the search for a substring, iterating, until a criterion is reached and as long as the search is positive, the steps of:
adding at least one character to said search substring;
searching for the substring thus increased in said plurality of entry strings of characters of the dictionary.

4. The method according to claim 1, wherein said selected indexing dictionary comprises a plurality of entries corresponding to values predefined before coding the structured document.

5. The method according to claim 1, comprising at least:
a prior step of coding a prior value preceding said string of characters to be coded in the document,
a prior step of adding, in said at least one selected indexing dictionary, an entry corresponding to the prior value, and wherein
during said coding by reference, the reference relates to said added entry.

6. The method according to claim 1, wherein said coding by reference comprises coding a coding data item corresponding to an entry of at least one dictionary of references, wherein an entry of said dictionary of references gives identification information on an entry of the selected indexing dictionary, an item of positioning information and an item of length information.

7. The method according to claim 6, wherein said identification information comprises an identifier of a dictionary among the plurality of indexing dictionaries, and an identifier of said entry identified within said selected indexing dictionary.

8. The method according to claim 1, comprising determining preferential positions in the entry identified, and wherein said positioning information is established, at least in said other cases, in relation to at least one of said determined preferential positions.

9. The method according to claim 1, wherein the length information comprises a code among a finite set of length codes corresponding respectively to a finite set of lengths, and a third code combined with a value for the length not included in said set, and
said positioning and length information is encoded jointly by an adaptive encoding of said first code, second code, third code and length codes.

10. The method according to claim 1, wherein the length information comprises a code among a finite set of length codes corresponding respectively to a finite set of lengths, and a third code combined with a value for the length not included in said set.

11. The method according to claim 1, wherein said structured document comprises structure data to be coded, and the method comprising coding a structure data item which comprises the following steps:
predicting at least part of the information forming said structure data item, from a coding grammar;
if a result of the predicting is positive, encoding a conformity information representing this positive result, and encoding other information of said structure data not included in said predicted part.

12. The method according to claim 11, wherein a plurality of predictions is made for successive structure data, said method comprising:
determining whether there exists a succession of correct predictions for structure data, and
if a result of said determining step is positive, coding a number of successive correct predictions.

13. The method according to claim 1, wherein said step of selecting at least one indexing dictionary depends on a type of value to be coded.

14. The method according to claim 1, wherein the character string to be coded and the character string of the at least one identified dictionary entry are different character strings.

15. The method according to claim 1, wherein the selecting of an indexing dictionary depends on a type of the item that takes the character string to be coded.

16. The method according to claim 15, wherein the plurality of dictionaries comprises a global coding dictionary and at least one local coding dictionary, wherein each local coding dictionary stores values taken by items of a given type and the global coding dictionary stores values taken by the items regardless of type.

17. A method of decoding coded data of a structured document into decoded string of characters, the method comprising a step of decoding the coded data by substituting a decoded string of characters from at least one decoding dictionary for a coding index, said at least one decoding dictionary comprising entries, each entry associating a respective coding index with a decoded string of characters, the method further comprising:
identifying, in said coded data to decode, and decoding, at least one item of reference information linking a string of characters of an entry in the decoding dictionary to the decoded string of characters corresponding to the coded data to decode, by matching between at least a continuous part of the decoded string of characters corresponding to the coded data to decode or the string of characters of the entry in the decoding dictionary and a continuous subpart of other string of characters; and
wherein said at least one item of reference information comprises an identifier of a selected indexing dictionary from amongst a plurality of indexing dictionaries, an item of information identifying said entry identified in the selected indexing dictionary, an item of information on positioning which indicates a first character of the identified entry string of characters that matches the part or subpart of the decoded string of characters and an item of information on length of the matching part and subpart representing a number of characters of the matching part and subpart;
recovering said part or subpart of the string of characters of the entry from said decoded reference information so as to form, at least partly, the decoded string of characters corresponding to the coded data to decode, wherein the decoding dictionary is distinct from the structured document, wherein the item of information identifying said indexing dictionary, the item of information identifying said entry, the item of information on positioning, and the item of length information, are distinct information items, wherein the selected indexing dictionary comprises an entry corresponding to an already decoded substring of said string of characters to be decoded, so that a subsequent substring of said string of characters to be decoded is decoded with reference to said already decoded substring, and wherein the positioning information is selected from a set comprising a first code when said part or subpart of the string of characters to be decoded corresponds to a start of the entry identified, a second code when said part or subpart of the string of characters to be decoded corresponds to an end of the entry identified, and an offset value of the position of said part or subpart of the string of characters to be decoded in the entry identified, in other cases.

18. The method according to claim 17, wherein decoding the coded data corresponding to the decoded string of characters comprises a succession of partial decodings of parts of said coded data in order to form decoded subparts of the decoded character string and a concatenation of said subparts so as to form said decoded character string, each partial decoding comprising one from:
   identifying and decoding reference information followed by said step of recovering; and
   direct decoding at least one character.

19. The method according to claim 17, wherein a plurality of coded data corresponding to a plurality of other decoded strings of characters of said document is identified and stored in said dictionary, prior to said decoding of the coded data corresponding to the decoded character string, and said step of recovering comprises the decoding of the coded data associated with the referenced entry.

20. The method according to claim 17, comprising a step of determining, in a bitstream of the coded data, an item of coded data to be decoded using at least one indication indicating the end of said item of coded data.

21. A method of accessing part of a structured document comprising the decoding of said document according to the method of claim 17, the method comprising identifying and storing a plurality of coded data corresponding to decoded values situated, in said document, before said part to be accessed, and decoding said part to be accessed,
   said decoding of the part to be accessed comprising, for at least one coded data of said part to be accessed, said identifying and decoding of reference information followed by said recovering.

22. A system of coding a structured document comprising values to be coded, the system comprising: a processor; a memory connected to the processor; and instructions stored on the memory to cause the processor to: code
   items that take at least one string of characters by substituting a coding index from at least one indexing dictionary for said at least one string of characters to be coded, said at least one indexing dictionary comprising entries, each entry associating a respective coding index with a corresponding string of characters, the system further comprising:
select at least one indexing dictionary from among a plurality of indexing dictionaries;

identify at least one dictionary entry in the selected indexing dictionary whose character string is linked to a a string of characters to be coded by matching between at least a continuous part of the string of characters of the dictionary entry or the string of characters to be coded and a continuous subpart of the other character string, wherein the coding codes the string of characters to be coded by reference, according to the matching, to the at least one identified dictionary entry, and wherein, said coding by reference comprises coding an identifier of the selected indexing dictionary from amongst the plurality of indexing dictionaries, an item of information identifying said entry identified in the selected indexing dictionary, an item of information on positioning which indicates a first character of the identified entry string of characters that matches the part or subpart of the string of characters to be coded and an item of information on length of the matching part and subpart representing a number of characters of the matching part and subpart, wherein said indexing dictionaries are distinct from the structured document, wherein the item of information identifying said selected indexing dictionary, the item of information identifying said entry, the item of information on positioning, and the item of length information, are distinct information items, wherein the selected indexing dictionary comprises an entry corresponding to an already coded substring of said string of characters to be coded, so that a subsequent substring of said string of characters to be coded is coded with reference to said already coded substring, and wherein the positioning information is selected from a set comprising a first code when said part or subpart of the string of characters to be coded corresponds to a start of the entry identified, a second code when said part or subpart of the string of characters to be coded corresponds to an end of the entry identified, and an offset value of the position of said part or subpart of the string of characters to be coded in the entry identified, in other cases.

23. A system of decoding coded data of a structured document into decoded string of characters, the device comprising a processor, a memory connected to the processor and instructions stored on the memory to cause the processor to decode the coded data by substituting a decoded string of characters from at least one decoding dictionary for a coding index, said at least one decoding dictionary comprising entries, each entry associating a respective coding index with a decoded string of characters, wherein the decoding further comprises:
   identify, in the coded data to decode, and for decoding, at least one item of reference information linking a string of characters of an entry in the decoding dictionary to the decoded string of characters corresponding to the coded data to decode, by matching between at least a continuous part of the decoded string of characters corresponding to the coded data to decode or the string of characters of the entry in the decoding dictionary and a continuous subpart of the other character string;
   wherein said at least one item of reference information comprises an identifier of a selected indexing dictionary from amongst a plurality of indexing dictionaries, an item of information identifying said entry identified in the selected indexing dictionary, an item of information on positioning which indicates a first character of the identified entry string of characters that matches the part or subpart of the decoded string of characters and an item of information on length of the matching part and subpart representing a number of characters of the matching part and subpart;

recover the part or subpart of the string of characters of the entry from the decoded reference information so as to form, at least partly, the decoded string of characters corresponding to the coded data to decode, wherein the decoding dictionary is distinct from the structured document, wherein the item of information identifying said indexing dictionary, the item of information identifying said entry, the item of information on positioning, and the item of length information, are distinct information items, wherein the selected indexing dictionary comprises an entry corresponding to an already decoded substring of said string of characters to be decoded, so that a subsequent substring of said string of characters to be decoded is decoded with reference to said already decoded substring, and wherein the positioning information is selected from a set comprising a first code when said part or subpart of the string of characters to be decoded corresponds to a start of the entry identified, a second code when said part or subpart of the string of characters to be decoded corresponds to an end of the entry identified, and an offset value of the position of said part or subpart of the string of characters to be decoded in the entry identified, in other cases.

24. Non-transitory information storage readable by a computer system, comprising instructions for a computer program to implement the method according to claim 1, 17 or 21, when the program is loaded onto and executed by the computer system.

25. A method of coding a structured document comprising string of characters to be coded, the method comprising a step of coding, using at least one indexing dictionary comprising entries, at least one character string to be coded, the method further comprising:

selecting at least one indexing dictionary from among a plurality of indexing dictionaries;

identifying at least one entry in the selected indexing dictionary linked to the string of characters to be coded, by matching between at least a continuous part of the string of characters to be coded and a continuous subpart of the string of characters the at least one entry of the selected indexing dictionary, wherein the string of characters to be coded and the string of characters of the at least one entry of the selected indexing dictionary are different; and coding the string of characters to be coded by reference, according to the matching, to the at least one identified entry of the selected indexing dictionary, wherein, said coding by reference comprises coding an identifier of the selected indexing dictionary from amongst the plurality of indexing dictionaries, and item of information identifying said entry identified in the selected indexing dictionary, an item of information on positioning which indicates a first character of the identified entry string of characters that matches the part or subpart of the string of characters to be coded and an item of information on length of the matching part and subpart representing a number of characters of the matching part and subpart, wherein said indexing dictionaries are distinct from the structured document, wherein the item of information identifying said selected indexing dictionary, the item of information identifying said entry, the item of information on positioning, and the item of length information, are distinct information items, wherein the selected indexing dictionary comprises an entry corresponding to an already coded substring of said string of characters to be coded, so that a subsequent substring of said string of characters to be coded is coded with reference to said already coded substring, and wherein the positioning information is selected from a set comprising a first code when said part or subpart of the string of characters to be coded corresponds to a start of the entry identified, a second code when said part or subpart of the string of characters to be coded corresponds to an end of the entry identified, and an offset value of the position of said part or subpart of the string of characters to be coded in the entry identified, in other cases.

* * * * *